(12) United States Patent
Nakamura et al.

(10) Patent No.: US 12,246,358 B2
(45) Date of Patent: Mar. 11, 2025

(54) SUBSTRATE CLEANING APPARATUS AND SUBSTRATE CLEANING METHOD

(71) Applicant: SCREEN Holdings Co., Ltd., Kyoto (JP)

(72) Inventors: Kazuki Nakamura, Kyoto (JP); Yoshifumi Okada, Kyoto (JP); Nobuaki Okita, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 0 days.

(21) Appl. No.: 18/467,683

(22) Filed: Sep. 14, 2023

(65) Prior Publication Data
US 2024/0091815 A1 Mar. 21, 2024

(30) Foreign Application Priority Data
Sep. 21, 2022 (JP) .................. 2022-150729

(51) Int. Cl.
*B08B 1/12* (2024.01)
*A46B 13/00* (2006.01)
(Continued)

(52) U.S. Cl.
CPC .............. *B08B 1/12* (2024.01); *A46B 13/008* (2013.01); *A46B 13/02* (2013.01); *B08B 1/32* (2024.01);
(Continued)

(58) Field of Classification Search
CPC .. B08B 1/12; B08B 1/32; B08B 3/022; B08B 5/023; B08B 13/00; A46B 13/008; A46B 13/02; H01L 21/67046; A46B 2200/3073
See application file for complete search history.

(56) References Cited

U.S. PATENT DOCUMENTS 8,851,092 B2 10/2014 Yamamoto et al.
9,120,120 B2 9/2015 Yamamoto et al.
(Continued)

FOREIGN PATENT DOCUMENTS

JP H11238714 8/1999
JP 2002177911 6/2002
(Continued)

OTHER PUBLICATIONS

Shinohara et al.; "Substrate Washing Device and Substrate Processing Device Having the Same". (Year: 2022).*
(Continued)

*Primary Examiner* — Sharidan Carrillo
(74) *Attorney, Agent, or Firm* — JCIPRNET

(57) ABSTRACT

A substrate cleaning apparatus includes an upper holding device holding an outer peripheral end of a substrate, and a lower surface brush contacting a lower surface of the substrate to clean the lower surface. The lower surface brush moves between a contact position where the lower surface brush contacts the lower surface of the substrate held by the upper holding device and a separation position where the lower surface brush is separated from the substrate held by the upper holding device by a certain distance. At the separation position, the lower surface brush rotates at a first rotation speed. At the contact position, the lower surface brush rotates at a second rotation speed higher than the first rotation speed at a time point when the lower surface brush contacts the lower surface and a time point when the lower surface brush is separated from the lower surface.

7 Claims, 12 Drawing Sheets

(51) Int. Cl.
  *A46B 13/02* (2006.01)
  *B08B 1/32* (2024.01)
  *B08B 3/02* (2006.01)
  *B08B 5/02* (2006.01)
  *B08B 13/00* (2006.01)
  *H01L 21/67* (2006.01)

(52) U.S. Cl.
  CPC ............. *B08B 3/022* (2013.01); *B08B 5/023* (2013.01); *B08B 13/00* (2013.01); *H01L 21/67046* (2013.01); *A46B 2200/3073* (2013.01)

(56) References Cited

U.S. PATENT DOCUMENTS

| | | |
|---|---|---|
| 11,203,094 B2 | 12/2021 | Murachi et al. |
| 2003/0029479 A1 | 2/2003 | Asano |
| 2006/0016462 A1 | 1/2006 | Asano |
| 2015/0027492 A1 | 1/2015 | Takiguchi et al. |
| 2018/0071883 A1 | 3/2018 | Murachi et al. |
| 2018/0151343 A1 | 5/2018 | Takiguchi et al. |
| 2019/0378733 A1 | 12/2019 | Hamaguchi et al. |
| 2020/0230778 A1 | 7/2020 | Murachi et al. |
| 2022/0088793 A1 | 3/2022 | Shinohara et al. |
| 2022/0093420 A1 | 3/2022 | Shinohara et al. |
| 2022/0161299 A1 | 5/2022 | Shinohara |

FOREIGN PATENT DOCUMENTS

| | | |
|---|---|---|
| JP | 2003059885 | 2/2003 |
| JP | 2009194034 | 8/2009 |
| JP | 2009283721 | 12/2009 |
| JP | 2010278103 | 12/2010 |
| JP | 2010287686 | 12/2010 |
| JP | 2011233646 | 11/2011 |
| JP | 5904169 | 4/2016 |
| JP | 2018046108 | 3/2018 |
| JP | 2019145687 | 8/2019 |
| JP | 2019216153 | 12/2019 |
| JP | 2022051029 | 3/2022 |
| TW | 201811451 | 4/2018 |
| TW | 202221767 | 6/2022 |

OTHER PUBLICATIONS

Takahashi et al. "Substrate Cleaning Device and Substrate Cleaning Method" (Year: 2023).*

* cited by examiner

Lower surface central region

Lower surface outer region

Contact region and separation region

Gap region

Diagram of contamination distribution on the lower surface of the substrate after cleaning according to the example Diagram of contamination distribution on the lower surface of the substrate after cleaning according to the comparative example

SUBSTRATE CLEANING APPARATUS AND SUBSTRATE CLEANING METHOD

CROSS-REFERENCE TO RELATED APPLICATION

This application claims the priority benefits of Japanese application no. 2022-150729, filed on Sep. 21, 2022. The entirety of the above-mentioned patent application is hereby incorporated by reference herein and made a part of this specification.

BACKGROUND

Technical Field

The disclosure relates to a substrate cleaning apparatus and a substrate cleaning method for cleaning the lower surface of a substrate.

Description of Related Art

A substrate processing apparatus has been used to perform various types of processing on various substrates such as a FPD (Flat Panel Display) substrate used in a liquid crystal display device or an organic EL (Electro Luminescence) display device, a semiconductor substrate, an optical disk substrate, a magnetic disk substrate, a magneto-optical disk substrate, a photomask substrate, a ceramic substrate, and a solar cell substrate. A substrate cleaning apparatus is used to clean the substrate.

The substrate cleaning apparatus described in Japanese Patent Application Laid-Open No. 2022-51029 includes an upper holding device, a lower holding device, and a lower surface cleaning device.

The upper holding device includes a pair of lower chucks and a pair of upper chucks. A substrate arranged between the pair of lower chucks and between the pair of upper chucks is sandwiched between the pair of lower chucks and the pair of upper chucks. Thus, the substrate to be cleaned is held with the pair of lower chucks and the pair of upper chucks in contact with an outer peripheral end of the substrate. The lower surface cleaning device cleans a lower surface central region of the substrate that is held by the upper holding device.

The lower holding device is a so-called spin chuck, and rotates the substrate in a horizontal posture while sucking and holding the lower surface central region of the substrate. The lower surface cleaning device also cleans a region (hereinafter referred to as a lower surface outer region) surrounding the lower surface central region on the lower surface of the substrate that is held by the lower holding device.

The lower surface cleaning device described above cleans the lower surface central region and the lower surface outer region of the substrate by bringing a lower surface brush (cleaning tool) into contact with the lower surface of the substrate. However, when the substrate is physically cleaned in this way, the cleanliness of the substrate after cleaning may decrease due to the contact between the cleaning tool and the substrate.

The disclosure provides a substrate cleaning apparatus and a substrate cleaning method capable of improving the cleanliness of the lower surface of the substrate after cleaning.

SUMMARY

A substrate cleaning apparatus according to one aspect of the disclosure includes: a first substrate holding part holding an outer peripheral end of a substrate; a cleaning tool coming into contact with a lower surface of the substrate and cleaning the lower surface of the substrate; a cleaning tool rotation driving part rotating the cleaning tool around an axis in an up-down direction; and a cleaning tool moving part moving the cleaning tool rotated by the cleaning tool rotation driving part between a contact position where the cleaning tool comes into contact with the lower surface of the substrate held by the first substrate holding part and a separation position where the cleaning tool is separated from the lower surface of the substrate held by the first substrate holding part by a predetermined distance. The cleaning tool rotation driving part rotates the cleaning tool at a first rotation speed in response to the cleaning tool being at the separation position, and rotates the cleaning tool at a second rotation speed that is higher than the first rotation speed at at least one of a first time point and a second time point in a case where the first time point is a time point at which the cleaning tool in a state of being separated from the lower surface of the substrate comes into contact with the lower surface of the substrate in response to the cleaning tool moving from the separation position to the contact position, and the second time point is a time point at which the cleaning tool in a state of contacting the lower surface of the substrate is separated from the lower surface of the substrate in response to the cleaning tool moving from the contact position to the separation position.

A substrate cleaning method according to another aspect of the disclosure includes: holding an outer peripheral end of a substrate with a first substrate holding part; bringing a cleaning tool into contact with a lower surface of the substrate and cleaning the lower surface of the substrate; rotating the cleaning tool around an axis in an up-down direction; and moving the cleaning tool rotated around the axis in the up-down direction between a contact position where the cleaning tool comes into contact with the lower surface of the substrate held by the first substrate holding part and a separation position where the cleaning tool is separated from the lower surface of the substrate held by the first substrate holding part by a predetermined distance. Rotating the cleaning tool around the axis in the up-down direction includes rotating the cleaning tool at a first rotation speed in response to the cleaning tool being at the separation position, and rotating the cleaning tool at a second rotation speed that is higher than the first rotation speed at at least one of a first time point and a second time point in a case where the first time point is a time point at which the cleaning tool in a state of being separated from the lower surface of the substrate comes into contact with the lower surface of the substrate in response to the cleaning tool moving from the separation position to the contact position, and the second time point is a time point at which the cleaning tool in a state of contacting the lower surface of the substrate is separated from the lower surface of the substrate in response to the cleaning tool moving from the contact position to the separation position.

Other features, elements, characteristics, and advantages of the present disclosure will become more apparent from the following description of preferred embodiments of the present disclosure with reference to the attached drawings.

DESCRIPTION OF THE EMBODIMENTS

A substrate cleaning apparatus and a substrate cleaning method according to embodiments of the disclosure will be described below with reference to the drawings. In the following description, the substrate refers to a semiconductor substrate (wafer), a FPD (Flat Panel Display) substrate for a liquid crystal display device or an organic EL (Electro Luminescence) display device, an optical disk substrate, a magnetic disk substrate, a magneto-optical disk substrate, a photomask substrate, a ceramic substrate, a solar cell substrate, or the like. In the following description, the upper surface of the substrate is a circuit forming surface (front surface), and the lower surface of the substrate is a surface (back surface) opposite to the circuit forming surface. Besides, the substrate has a circular shape with no notch.

1. CONFIGURATION OF THE SUBSTRATE CLEANING APPARATUS

Figure 1:
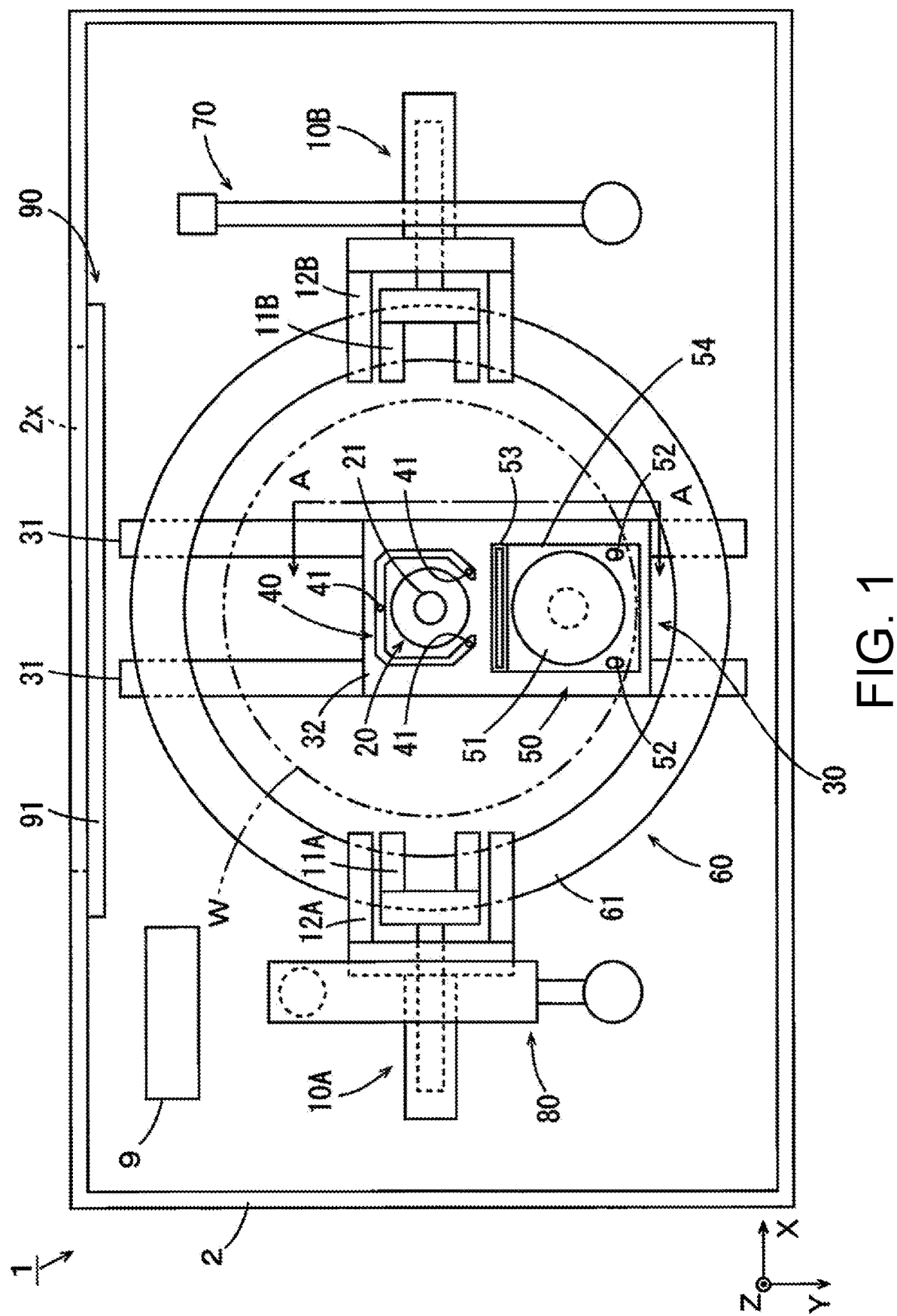
FIG. 1 is a schematic plan view of the substrate cleaning apparatus according to the first embodiment.
Figure 2:
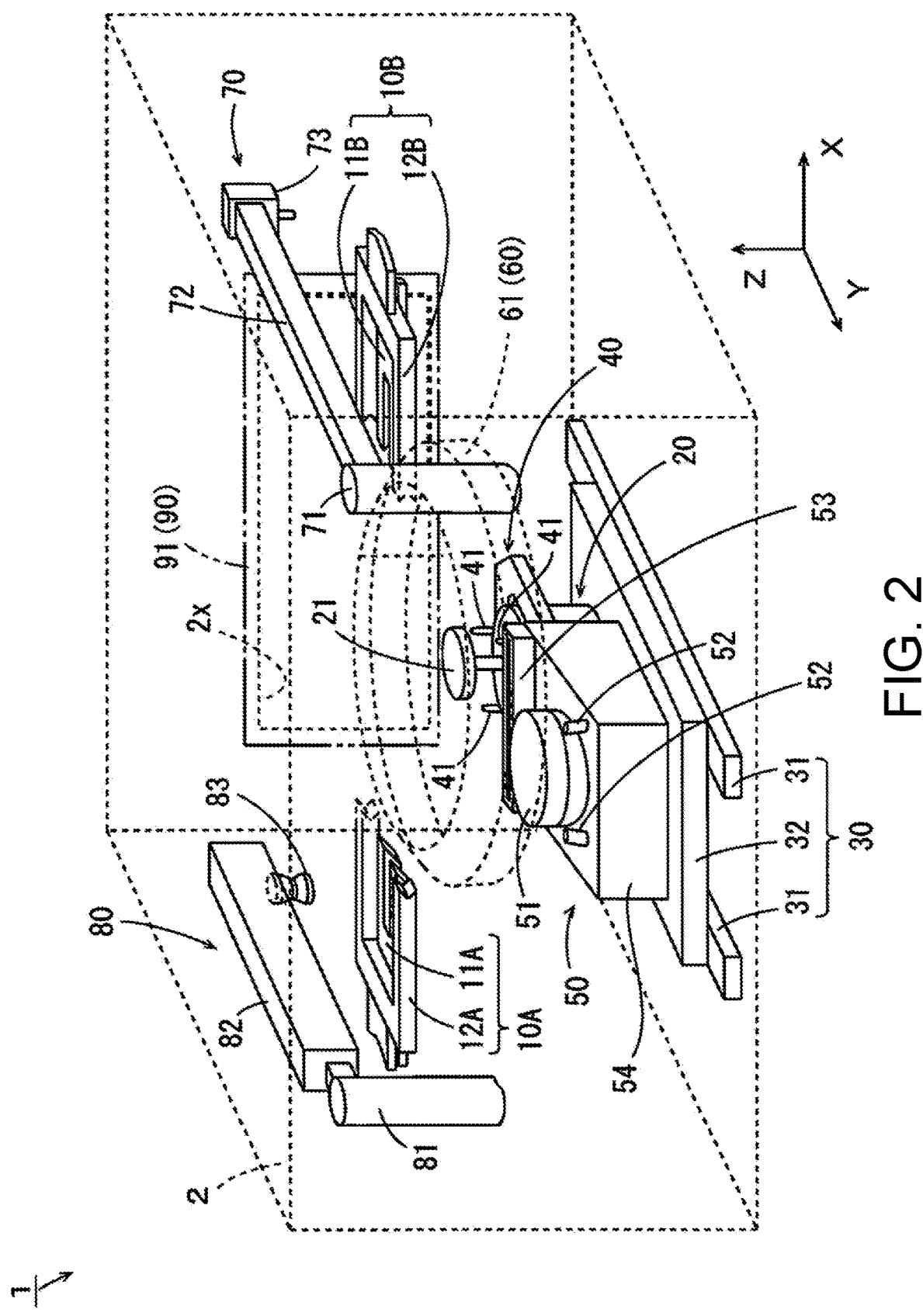
FIG. 2 is a perspective view showing the internal configuration of the substrate cleaning apparatus of FIG. 1.

FIG. 1 is a schematic plan view of the substrate cleaning apparatus according to the first embodiment. FIG. 2 is a perspective view showing the internal configuration of the substrate cleaning apparatus 1 of FIG. 1. In the substrate cleaning apparatus 1 according to this embodiment, the X direction, Y direction, and Z direction which are orthogonal to one another are defined in order to clarify the positional relationship. In FIG. 1 and FIG. 2 and subsequent drawings, the X direction, Y direction, and Z direction are indicated by arrows as appropriate. The X direction and the Y direction are orthogonal to each other in the horizontal plane, and the Z direction corresponds to the up-down direction (vertical direction).

As shown in FIG. 1 and FIG. 2, the substrate cleaning apparatus 1 has a configuration in which upper holding devices 10A and 10B, a lower holding device 20, a pedestal device 30, a transfer device 40, a lower surface cleaning device 50, a cup device 60, an upper surface cleaning device 70, an end cleaning device 80, and an opening/closing device 90 are accommodated in a unit housing 2. In FIG. 2, the unit housing 2 is indicated by dotted lines.

The unit housing 2 has a rectangular parallelepiped shape and includes a rectangular bottom surface portion and four sidewall portions extending upward from four sides of the bottom surface portion. Two of the four sidewall portions face each other in the Y direction. The other two of the four sidewall portions face each other in the X direction. A loading/unloading port 2x for a substrate W is formed in the center of one of the four sidewall portions. The opening/closing device 90 is provided in the vicinity of the loading/unloading port 2x. The opening/closing device 90 includes a shutter 91 and is configured to be capable of opening and closing the loading/unloading port 2x with the shutter 91.

The pedestal device 30 is provided on the bottom surface portion of the unit housing 2. The pedestal device 30 includes a linear guide 31 and a movable pedestal 32. The linear guide 31 includes two rails that are arranged in the X direction and extends in the Y direction to cross the central portion of the bottom surface portion in the X direction. The pedestal device 30 is configured to be capable of moving the movable pedestal 32 to a plurality of positions in the Y direction on the two rails of the linear guide 31.

The lower holding device 20 and the lower surface cleaning device 50 are provided on the movable pedestal 32 to be arranged in the Y direction. The lower holding device 20 is fixed to the upper surface of the movable pedestal 32 and includes a suction holding part 21. The suction holding part 21 is a so-called spin chuck and has a circular suction surface for sucking and holding the lower surface of the substrate W. In addition, the suction holding part 21 is configured to be rotatable around an axis that extends in the up-down direction (axis in the Z direction). The lower holding device 20 sucks and holds the lower surface of the substrate W with the suction holding part 21 and rotates the sucked and held substrate W around the axis that extends in the up-down direction.

In the following description, a region on the lower surface of the substrate W, to be sucked and held by the suction surface of the suction holding part 21 when the substrate W is sucked and held by the suction holding part 21, is referred to as a lower surface central region. A region surrounding the lower surface central region on the lower surface of the substrate W is referred to as a lower surface outer region.

The transfer device 40 is provided on the movable pedestal 32 in the vicinity of the lower holding device 20. The transfer device 40 has a plurality (three in this example) of support pins 41 that are provided to surround the suction holding part 21 in plan view and extend in the up-down direction. The plurality of support pins 41 are provided to be capable of moving up and down between a plurality of predetermined height positions.

As will be described later, the upper holding devices 10A and 10B are configured to be capable of holding the substrate W at a position above the lower holding device 20. The transfer device 40 is capable of receiving the substrate W held by the lower holding device 20 and transferring the substrate W to the upper holding devices 10A and 10B by raising and lowering the plurality of support pins 41. Further, the transfer device 40 is capable of receiving the substrates W held by the upper holding devices 10A and 10B and transferring the substrate W to the lower holding device 20.

The lower surface cleaning device 50 includes a lower surface brush 51, two liquid nozzles 52, a gas ejection part 53, an elevation rotation support part 54, and various driving parts (not shown). The elevation rotation support part 54 is fixed to the upper surface of the movable pedestal 32 to be adjacent to the lower holding device 20 in the Y direction. As shown in FIG. 1, the lower surface brush 51 has a circular cleaning surface that is capable of coming into contact with the lower surface of the substrate W. In addition, the lower surface brush 51 is attached to the elevation rotation support part 54 with the cleaning surface facing upward so that the cleaning surface is rotatable around an axis that extends in the up-down direction through the center of the cleaning surface. The area of the cleaning surface of the lower surface brush 51 is larger than the area of the suction surface of the suction holding part 21. The lower surface brush 51 is made of, for example, a PVA (polyvinyl alcohol) sponge or a PVA sponge dispersed with abrasive grains.

The elevation rotation support part 54 includes an elevation mechanism for raising and lowering the lower surface brush 51 and a brush driving mechanism for rotating the lower surface brush 51. The elevation rotation support part 54 moves up and down by the elevation mechanism while the substrate W is held by the lower holding device 20 or the upper holding devices 10A and 10B. Thus, the elevation rotation support part 54 moves the lower surface brush 51 between height positions (second height position and third height position which will be described later) at which the lower surface brush 51 contacts the lower surface of the substrate W and a height position (first height position which will be described later) separated downward from the substrate W by a certain distance.

Furthermore, the elevation rotation support part 54 rotates the lower surface brush 51 by the brush driving mechanism. Thus, the lower surface brush 51 rotates at the height position where the lower surface brush 51 is in contact with the lower surface of the substrate W, thereby cleaning the portion of the lower surface of the substrate W that is in contact with the lower surface brush 51.

Each of the two liquid nozzles 52 is positioned near the lower surface brush 51 and is attached to the elevation rotation support part 54 with a liquid ejection port facing the cleaning surface of the lower surface brush 51. A cleaning liquid supply system (not shown) is connected to the liquid nozzle 52. In a state where the lower surface brush 51 is at a standby position, a cleaning liquid is supplied from each liquid nozzle 52 toward the lower surface brush 51, and the lower surface brush 51 rotates. In this case, the cleaning liquid supplied to the lower surface brush 51 flows smoothly on the surface of the lower surface brush 51 or inside the lower surface brush 51 due to the centrifugal force generated by the rotation of the lower surface brush 51. Thus, contaminants adhering to the lower surface brush 51 are smoothly washed away by the cleaning liquid at the standby position. Besides, the cleaning liquid permeates into the lower surface brush 51, which prevents the lower surface brush 51 from drying out.

The gas ejection part 53 is a slit-shaped gas ejection nozzle having a gas ejection port that extends in one direction. The gas ejection part 53 is positioned between the lower surface brush 51 and the suction holding part 21 in plan view and is attached to the elevation rotation support part 54 with the gas ejection port facing upward. An ejection gas supply system (not shown) is connected to the gas ejection part 53. In this embodiment, nitrogen gas is used as the gas to be supplied to the gas ejection part 53. The gas ejection part 53 ejects the gas supplied from the ejection gas supply system to the lower surface of the substrate W when the lower surface brush 51 cleans the substrate W and dries the lower surface of the substrate W as described later. Thus, a strip-shaped gas curtain that extends in the X direction is formed between the lower surface brush 51 and the suction holding part 21.

The cup device 60 is provided in the substantially central part within the unit housing 2 and includes a cup 61. The cup 61 is provided to surround the lower holding device 20 and the pedestal device 30 in plan view and is capable of moving up and down. In FIG. 2, the cup 61 is indicated by dotted lines. The cup 61 moves between predetermined lower cup position and upper cup position depending on which portion of the lower surface of the substrate W is to be cleaned by the lower surface brush 51. The lower cup position is a height position where the upper end of the cup 61 is below the substrate W sucked and held by the suction holding part 21. The upper cup position is a height position where the upper end of the cup 61 is above the suction holding part 21.

The upper holding devices 10A and 10B are provided at a height position above the cup 61. The upper holding devices 10A and 10B face each other across the pedestal device 30 in plan view. The upper holding device 10A includes a lower chuck 11A and an upper chuck 12A. The upper holding device 10B includes a lower chuck 11B and an upper chuck 12B.

The lower chucks 11A and 11B are arranged symmetrically with respect to a vertical plane that extends in the Y direction through the center of the suction holding part 21 in plan view and are provided to be movable in the X direction within a common horizontal plane. Each of the lower chucks 11A and 11B has two support pieces that are capable of supporting the lower surface outer region of the substrate W from below. Like the lower chucks 11A and 11B, the upper chucks 12A and 12B are arranged symmetrically with respect to a vertical plane that extends in the Y direction through the center of the suction holding part 21 in plan view and are provided to be movable in the X direction within a common horizontal plane. Each of the upper chucks 12A and 12B has two holding pieces that are configured to be capable of abutting on two portions of the outer peripheral end of the substrate W and holding the outer peripheral end of the substrate W.

In the upper holding devices 10A and 10B, the distances between the lower chuck 11A and the upper chuck 12A and between the lower chuck 11B and the upper chuck 12B are adjusted. Thus, the upper holding devices 10A and 10B are capable of sandwiching the substrate W between the lower chuck 11A and the upper chuck 12A and between the lower chuck 11B and the upper chuck 12B to hold the substrate W at a position above the lower holding device 20. Furthermore, the upper holding devices 10A and 10B are capable of releasing the held substrate W by moving the lower chuck 11A and the upper chuck 12A away from each other and moving the lower chuck 11B and the upper chuck 12B away from each other.

As shown in FIG. 1, the upper surface cleaning device 70 is provided on one side of the cup 61 in the X direction. As shown in FIG. 2, the upper surface cleaning device 70 includes a rotation support shaft 71, an arm 72, and a spray nozzle 73. The rotation support shaft 71 is provided to extend in the up-down direction and to be vertically movable and rotatable. The arm 72 is provided to extend in the horizontal direction from the upper end of the rotation support shaft 71 at a position above the upper holding devices 10A and 10B. The spray nozzle 73 is attached to the tip of the arm 72. A fluid supply system (not shown) is connected to the spray nozzle 73. A cleaning liquid and gas are supplied to the spray nozzle 73 from the fluid supply system (not shown). Thus, the cleaning liquid and the gas are mixed in the spray nozzle 73 to generate a mixed fluid. The generated mixed fluid is sprayed downward from the spray nozzle 73.

In the upper surface cleaning device 70, for example, in a state where the substrate W is held by the lower holding device 20 and rotated, the height position of the rotation support shaft 71 is adjusted to move the spray nozzle 73 above the substrate W, and the rotation support shaft 71 rotates. In this state, the mixed fluid is sprayed onto the substrate W from the spray nozzle 73. Thereby, the entire upper surface of the substrate W is cleaned.

As shown in FIG. 1, the end cleaning device 80 is provided on the other side of the cup 61 in the X direction. As shown in FIG. 2, the end cleaning device 80 includes a rotation support shaft 81, an arm 82, and a bevel brush 83. The rotation support shaft 81 is provided to extend in the up-down direction and to be vertically movable and rotatable. The arm 82 is provided to extend in the horizontal direction from the upper end of the rotation support shaft 81 at a position above the upper holding devices 10A and 10B. The bevel brush 83 is provided at the tip of the arm 82 to protrude downward and be rotatable around an axis in the up-down direction.

In the end cleaning device 80, for example, in a state where the substrate W is held by the lower holding device 20 and rotated, the height position of the rotation support shaft 81 is adjusted to bring the bevel brush 83 into contact with the outer peripheral end of the substrate W, and the rotation support shaft 81 rotates. Further, the bevel brush 83 provided at the tip of the arm 82 rotates around an axis in the up-down direction. Thereby, the entire outer peripheral end of the substrate W is cleaned.

As shown in FIG. 1, the substrate cleaning apparatus 1 further includes a controller 9. The controller 9 includes, for example, a CPU (Central Processing Unit) and a memory or a microcomputer. The memory stores a substrate cleaning program. By executing the substrate cleaning program stored in the memory, the CPU of the controller 9 controls the operation of each of the components (10A, 10B, 20, 30, 40, 50, 60, 70, 80, 90) described above.

2. BASIC FLOW OF THE SUBSTRATE CLEANING PROCESS

Figure 3:
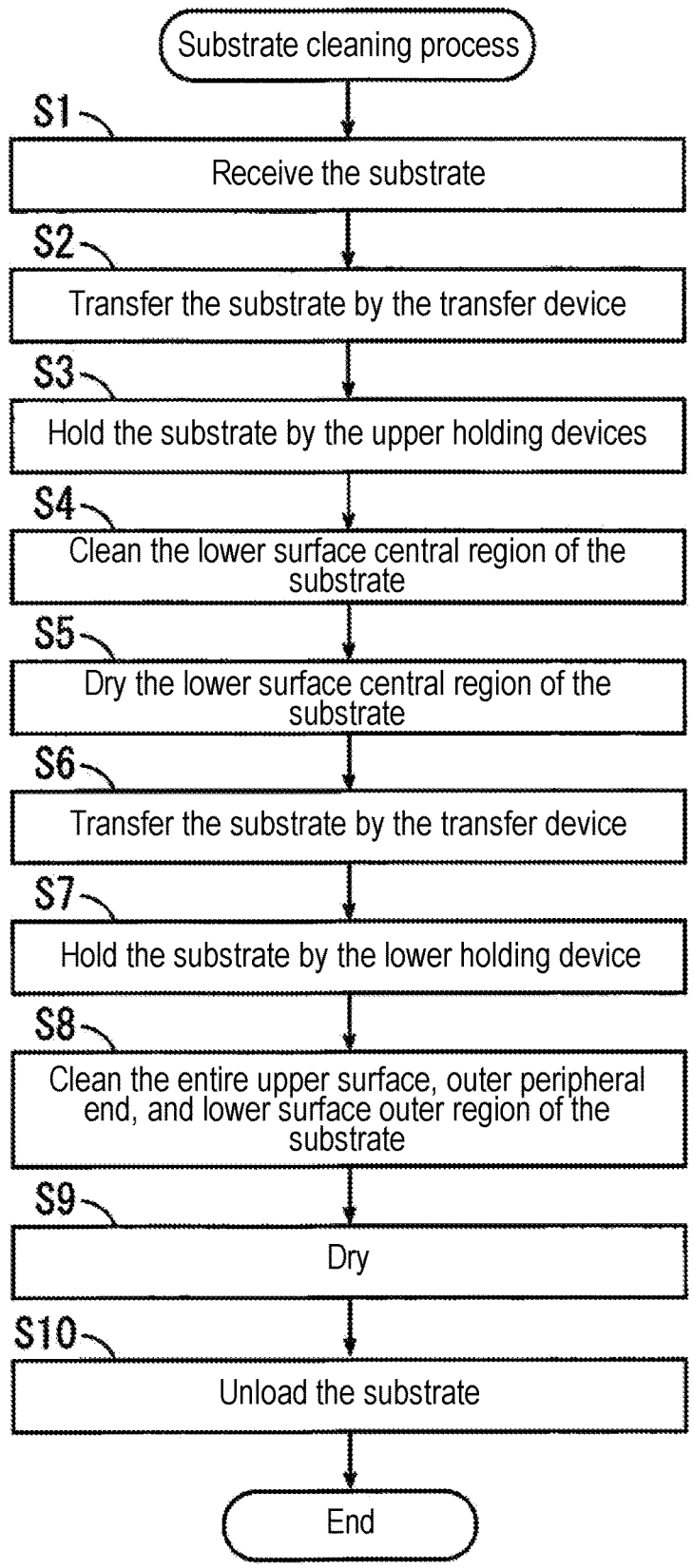
FIG. 3 is a flow chart showing the substrate cleaning process performed by the controller of FIG. 1.

A substrate cleaning process executed by the controller 9 of FIG. 1 in the substrate cleaning apparatus 1 will be described below. FIG. 3 is a flow chart showing the substrate cleaning process performed by the controller 9 of FIG. 1.

The substrate cleaning and drying process according to this embodiment is performed by the CPU of the controller 9 executing the substrate cleaning program stored in the storage device. In the initial state, the movable pedestal 32 of the pedestal device 30 is positioned to position the suction holding part 21 of the lower holding device 20 in the center of the cup 61 in plan view.

First, the controller 9 opens the loading/unloading port 2*x* by controlling the opening/closing device 90, and receives the substrate W loaded from the outside of the substrate cleaning apparatus 1 into the unit housing 2 (step S1).

Next, the controller 9 receives the substrate W with the plurality of support pins 41 and transfers the received substrate W to the upper holding devices 10A and 10B by controlling the transfer device 40 (step S2). At this time, the controller 9 holds the outer peripheral end of the substrate W at a position above the lower holding device 20 by controlling the upper holding devices 10A and 10B (step S3). If the substrate W loaded from the outside of the substrate cleaning apparatus 1 can be placed on the lower chucks 11A and 11B, the processing of step S2 may be omitted. The loading/unloading port 2*x* opened in step S1 is closed by the shutter 91 after the substrate W is received by the transfer device 40.

Thereafter, the controller 9 cleans the lower surface central region of the substrate W by controlling the pedestal device 30 and the lower surface cleaning device 50 (step S4). Details of the operation of each part of the substrate cleaning apparatus 1 during cleaning of the lower surface central region of the substrate W will be described later.

During the cleaning in step S4, the lower surface central region of the substrate W is cleaned by the lower surface brush 51 soaked with the cleaning liquid. As a result, the cleaning liquid adheres to the lower surface central region of the substrate W. Therefore, the controller 9 further controls the pedestal device 30 and the lower surface cleaning device 50 to dry the lower surface central region of the substrate W (step S5). Specifically, the controller 9 controls the pedestal device 30 to move the gas ejection part 53 with respect to the lower surface of the substrate W to pass through the lower surface central region in plan view in a state where the gas ejection part 53 ejects gas toward the lower surface of the substrate W (a state where the gas curtain is generated). Thereby, the cleaning liquid adhering to the substrate W in the lower surface central region is pushed out to a position away from the lower surface central region of the substrate W by the gas curtain, and the lower surface central region is dried.

Next, the controller 9 receives the substrate W held by the upper holding devices 10A and 10B with the plurality of support pins 41 and transfers the received substrate W to the lower holding device 20 by controlling the transfer device 40 (step S6).

Next, the controller 9 controls the lower holding device 20 to suck and hold the lower surface central region of the substrate W with the suction holding part 21 (step S7). In the processing of steps S6 and S7, the pedestal device 30 is positioned to position the center of the substrate W in the center of the suction holding part 21 in plan view. Thus, the substrate W is sucked and held by the suction holding part 21 with the center of the substrate W positioned on the rotation center (rotation axis) of the suction holding part 21.

Further, the controller 9 controls the lower holding device 20, the pedestal device 30, the lower surface cleaning device 50, the upper surface cleaning device 70, the end cleaning device 80, and a drying device 100 to clean the entire upper surface, the outer peripheral end, and the lower surface outer region of the substrate W (step S8). Details of the operation of each part of the substrate cleaning apparatus 1 during cleaning of the lower surface outer region of the substrate W will be described later.

After cleaning the entire upper surface, the outer peripheral end, and the lower surface outer region of the substrate W, the controller 9 controls the lower holding device 20 to rotate the substrate W at a high speed and dry the entire substrate W (step S9). The drying method of rotating the substrate W at a high speed to dry the entire substrate W is called spin drying.

Finally, the controller 9 controls the opening/closing device 90 to open the loading/unloading port 2x. Thereby, the substrate W is transported to the outside of the substrate cleaning apparatus 1 (step S10), and the substrate cleaning process is completed. The loading/unloading port 2x opened in step S10 is closed by the shutter 91 after the substrate W is unloaded.

The controller 9 holds the cup 61 at the upper cup position by controlling the cup device 60 in the processing of steps S8 and S9 of the series of processing described above. Thus, the droplets scattered from the substrate W during cleaning of the entire upper surface, the outer peripheral end, and the lower surface outer region of the substrate W and during spin drying of the substrate W are received by the cup 61 and discharged to the outside of the substrate cleaning apparatus 1. In addition, the controller 9 holds the cup 61 at the lower cup position by controlling the cup device 60 during the processing (steps S1 to S7 and S10) excluding steps S8 and S9 in the series of processing described above.

3. A PLURALITY OF REGIONS DEFINED ON THE LOWER SURFACE OF THE SUBSTRATE W

In order to illustrate details of the operation of each part of the substrate cleaning apparatus 1 when cleaning the lower surface central region and the lower surface outer region of the substrate W, first, a plurality of regions defined on the lower surface of the substrate W will be described. The plurality of regions include a contact region, a separation region, and a gap region in addition to the lower surface central region and the lower surface outer region described above.

Figure 4:
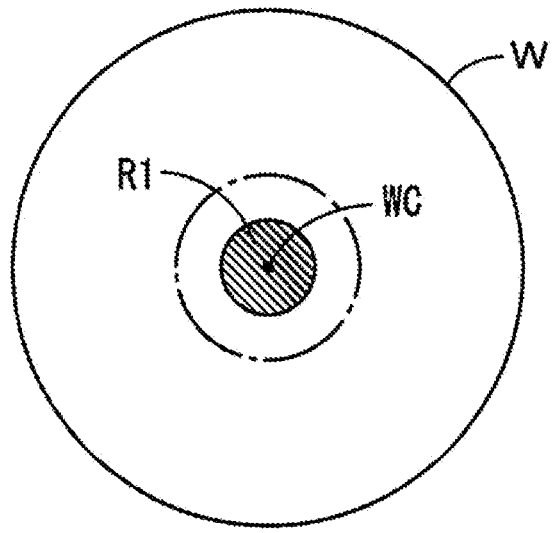
FIG. 4 is a view of the lower surface of the substrate for illustrating the lower surface central region defined in the substrate according to this embodiment.

FIG. 4 is a view of the lower surface of the substrate W for illustrating the lower surface central region defined in the substrate W according to this embodiment. The lower surface central region R1 is a region of the lower surface of the substrate W to which the suction surface of the suction holding part 21 is sucked, as described above. Therefore, the lower surface central region R1 has the same circular shape as the suction surface of the suction holding part 21, as indicated by hatching in FIG. 4. The center of the lower surface central region R1 coincides with or substantially coincides with the center WC of the substrate W. Besides, the area of the lower surface central region R1 is smaller than the area of the cleaning surface of the lower surface brush 51. In FIG. 4, the outer circumference circle of the lower surface brush 51 when the center of the lower surface brush 51 is aligned with the center WC of the substrate W is indicated by a one-dot chain line, together with the lower surface central region R1. The substrate W according to this embodiment has a diameter of 300 mm, for example. Moreover, the lower surface brush 51 has a diameter of about 108 mm. The diameter of the suction holding part 21 is smaller than 108 mm.

Figure 5:
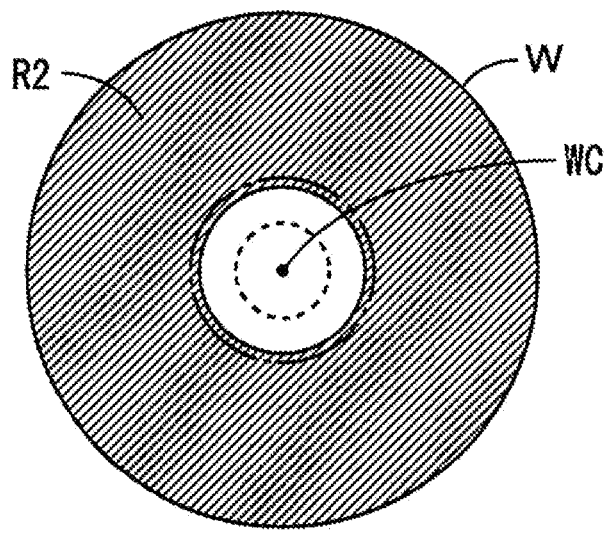
FIG. 5 is a view of the lower surface of the substrate for illustrating the lower surface outer region defined in the substrate according to this embodiment.

FIG. 5 is a view of the lower surface of the substrate W for illustrating the lower surface outer region defined in the substrate W according to this embodiment. The lower surface outer region R2 has an annular shape that includes the outer peripheral end of the substrate W and surrounds the lower surface central region R1, as indicated by hatching in FIG. 5. In FIG. 5, the outer shape of the lower surface central region R1 of FIG. 4 is indicated by a dotted line, together with the lower surface outer region R2. Furthermore, the outer circumference circle of the cleaning surface of the lower surface brush 51 when the center of the lower surface brush 51 is aligned with the center WC of the substrate W is indicated by a one-dot chain line. In this example, the inner diameter of the lower surface outer region R2 is smaller than the outer diameter of the cleaning surface of the lower surface brush 51. However, the inner diameter of the lower surface outer region R2 is not limited thereto and may coincide with the outer diameter of the cleaning surface of the lower surface brush 51.

Figure 6:
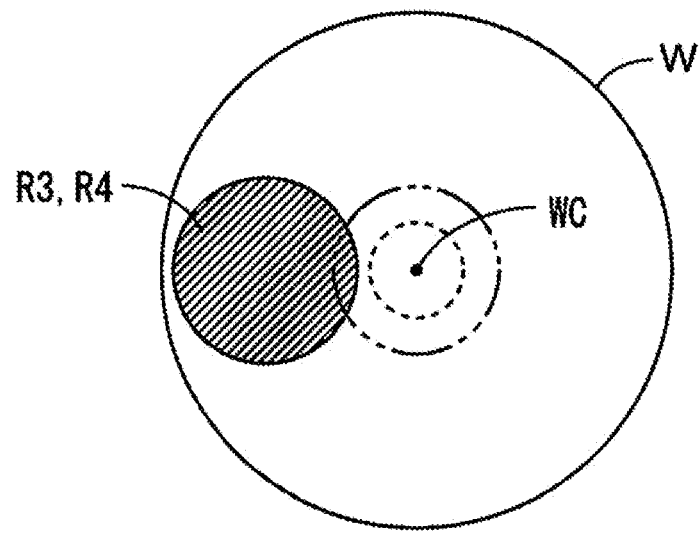
FIG. 6 is a view of the lower surface of the substrate for illustrating the contact region and the separation region defined in the substrate according to this embodiment.

FIG. 6 is a view of the lower surface of the substrate W for illustrating the contact region and the separation region defined in the substrate W according to this embodiment. The contact region according to this embodiment means a position on the lower surface of the substrate W when the lower surface brush 51 separated from the substrate W is brought into contact with the lower surface of the substrate W during cleaning of the lower surface central region R1 of the substrate W. In addition, the separation region according to this embodiment means a position on the lower surface of the substrate W when the lower surface brush 51 in contact with the substrate W is separated from the lower surface of the substrate W during cleaning of the lower surface central region R1 of the substrate W.

As indicated by hatching in FIG. 6, the contact region R3 and the separation region R4 according to this embodiment are defined at common positions on the lower surface of the substrate W, and both have the same circular shape as the cleaning surface of the lower surface brush 51. Further, the contact region R3 and the separation region R4 are located between the outer peripheral end of the substrate W and the lower surface central region R1 described above. In other words, the contact region R3 and the separation region R4 according to this embodiment do not overlap the lower surface central region R1 on the lower surface of the substrate W. In FIG. 6, the outer circumference circle of the lower surface central region R1 of FIG. 4 is indicated by a dotted line, together with the contact region R3 and the separation region R4. In addition, in FIG. 6, the inner circumference circle of the lower surface outer region R2 of FIG. 5 is indicated by a two-dot chain line.

Figure 7:
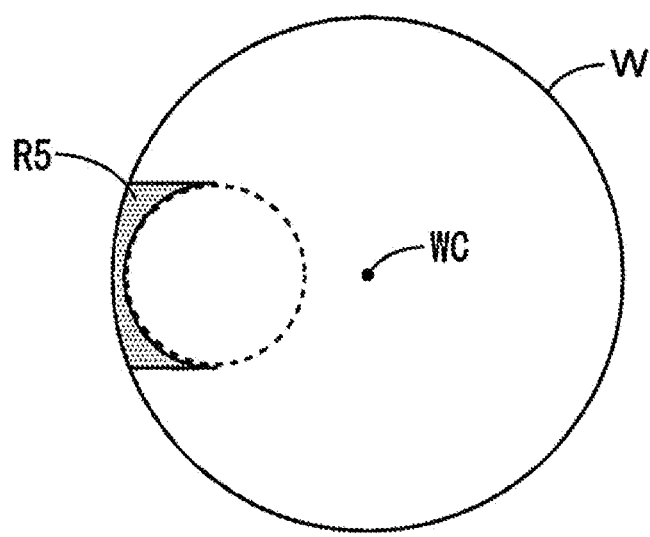
FIG. 7 is a view of the lower surface of the substrate for illustrating the gap region defined in the substrate according to this embodiment.

FIG. 7 is a view of the lower surface of the substrate W for illustrating the gap region defined in the substrate W according to this embodiment. The gap region R5 according to this embodiment is a region located between a part of the outer peripheral end of the substrate W and the contact region R3 and the separation region R4 of FIG. 6, as indicated by a dot pattern in FIG. 7. In FIG. 7, the outer circumference circle of the contact region R3 and the separation region R4 of FIG. 6 is indicated by a dotted line, together with the gap region R5.

4. DETAILS OF THE OPERATION OF EACH PART OF THE SUBSTRATE CLEANING APPARATUS 1 WHEN CLEANING THE LOWER SURFACE OF THE SUBSTRATE W

Figure 8:
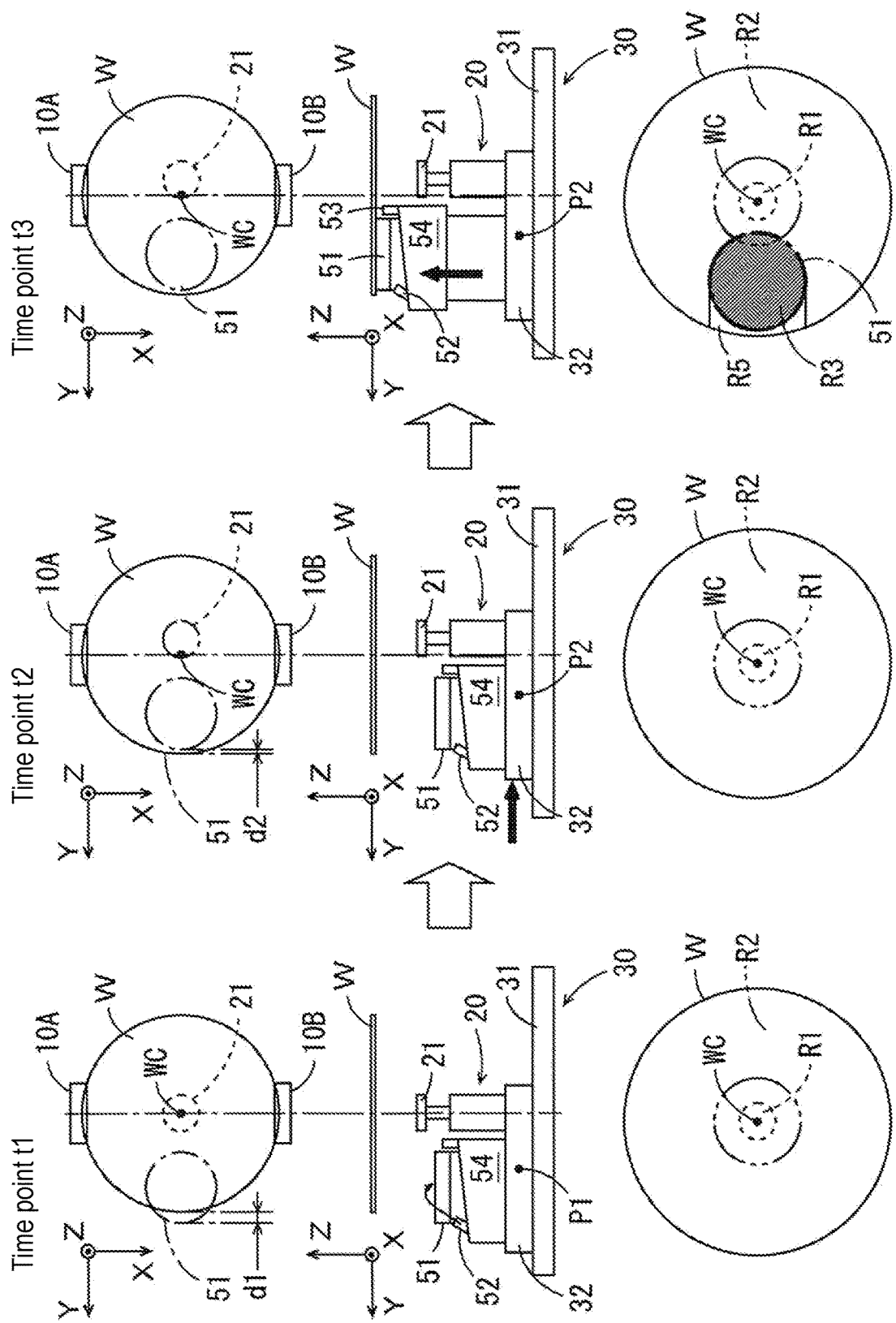
FIG. 8 is a diagram for illustrating details of the operation of each part of the substrate cleaning apparatus when cleaning the lower surface of the substrate.
Figure 9:
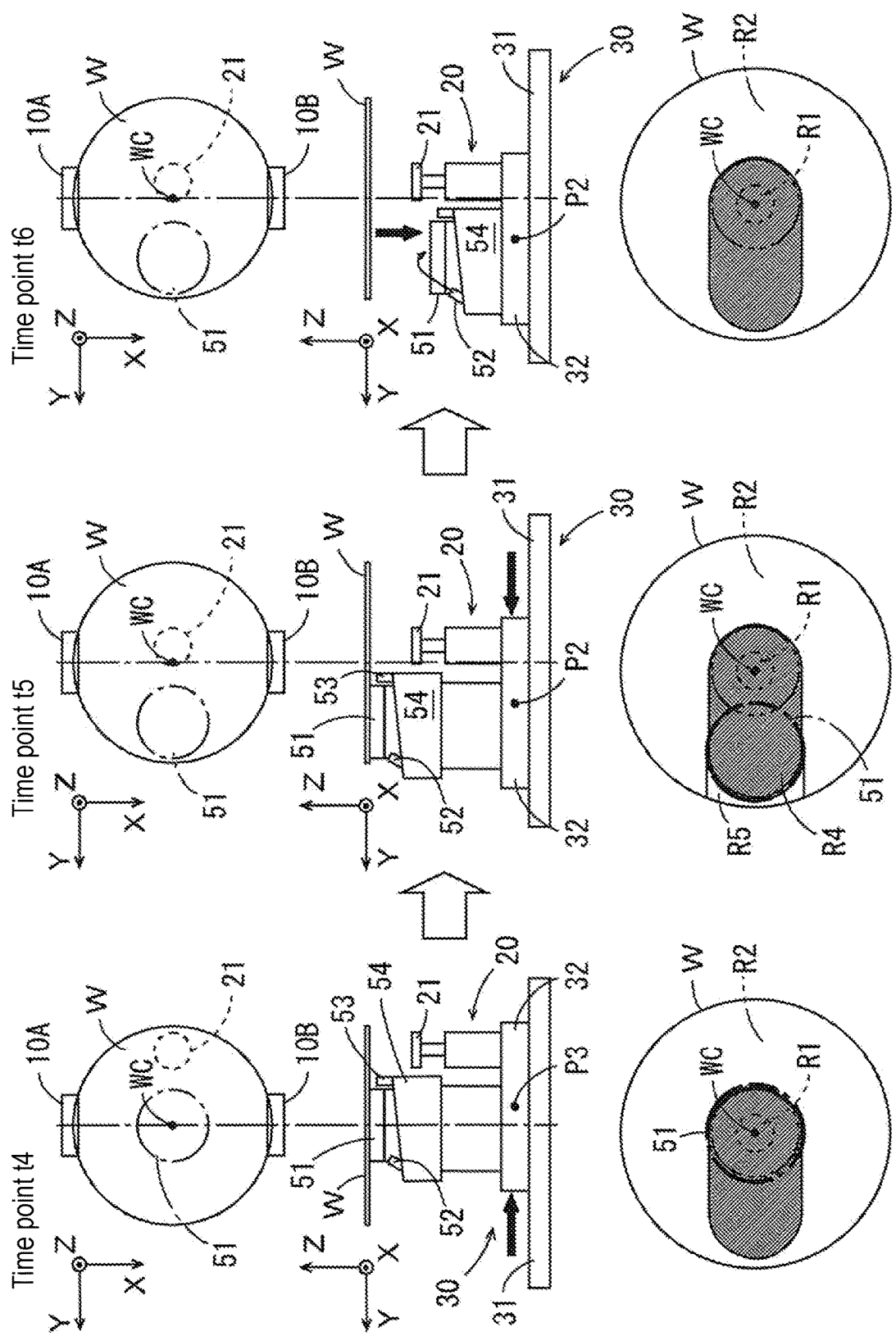
FIG. 9 is a diagram for illustrating details of the operation of each part of the substrate cleaning apparatus when cleaning the lower surface of the substrate.
Figure 10:
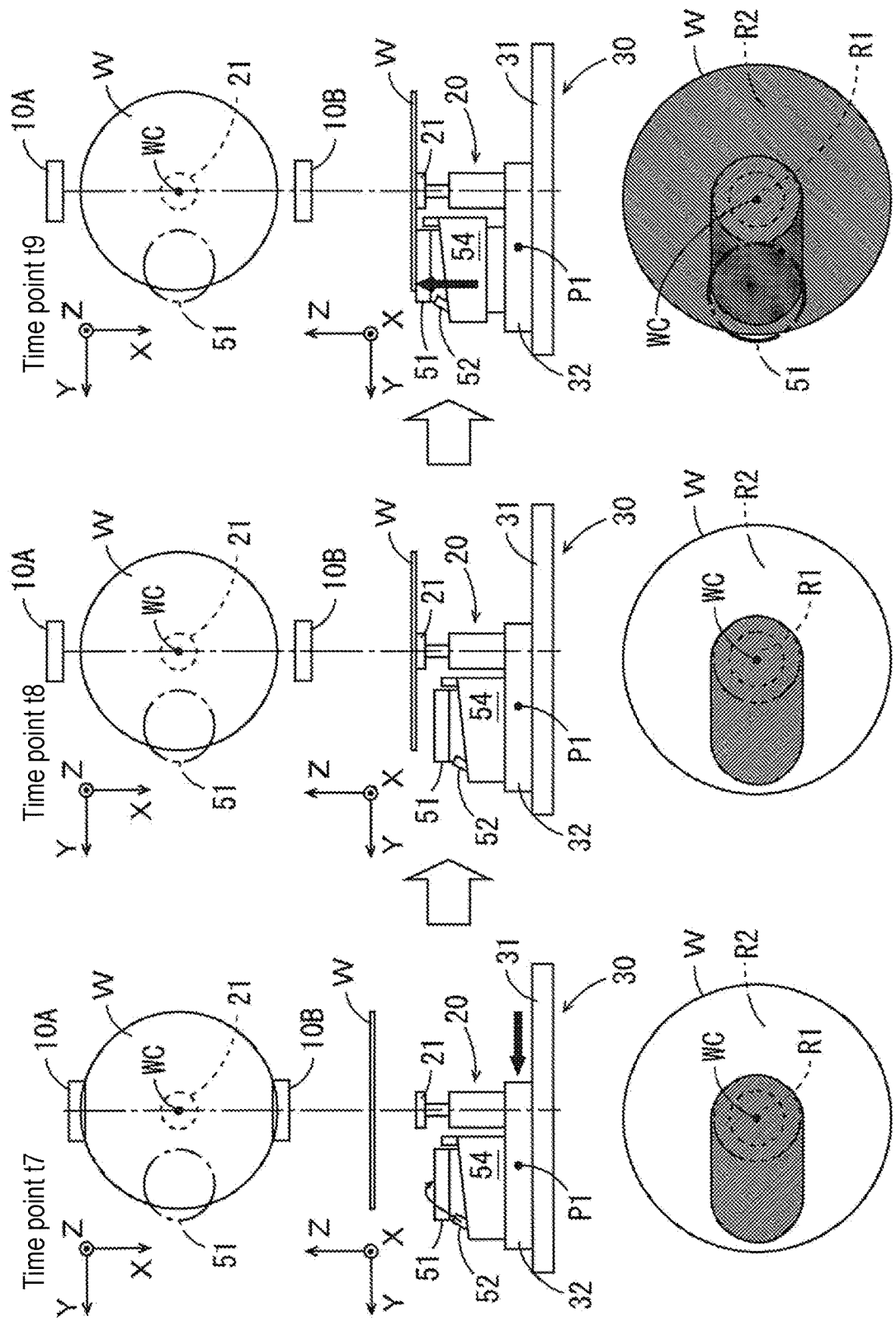
FIG. 10 is a diagram for illustrating details of the operation of each part of the substrate cleaning apparatus when cleaning the lower surface of the substrate.

FIG. 8 to FIG. 10 are diagrams for illustrating details of the operation of each part of the substrate cleaning apparatus 1 when cleaning the lower surface of the substrate W. The time of cleaning the lower surface of the substrate W here means a period from the time point of start of step S4 to the end of step S9 in FIG. 3. Each of FIG. 8 to FIG. 10 is shown so that the operating state of a part (mainly the lower holding device 20, the pedestal device 30, and the lower surface cleaning device 50) of the substrate cleaning apparatus 1 at a plurality of time points during cleaning of the lower surface of the substrate W is arranged in chronological order from left to right. FIG. 8 to FIG. 10 also show schematic plan views and schematic side views of the operating state of the substrate cleaning apparatus 1 at each time point. The schematic side views shown in FIG. 8 to FIG. 10 correspond to the schematic side views along the line A-A in FIG. 1. In addition, in FIG. 8 to FIG. 10, the cleaning state of the lower surface of the substrate W at each time point is shown by a lower surface view of the substrate W.

Figure 11:
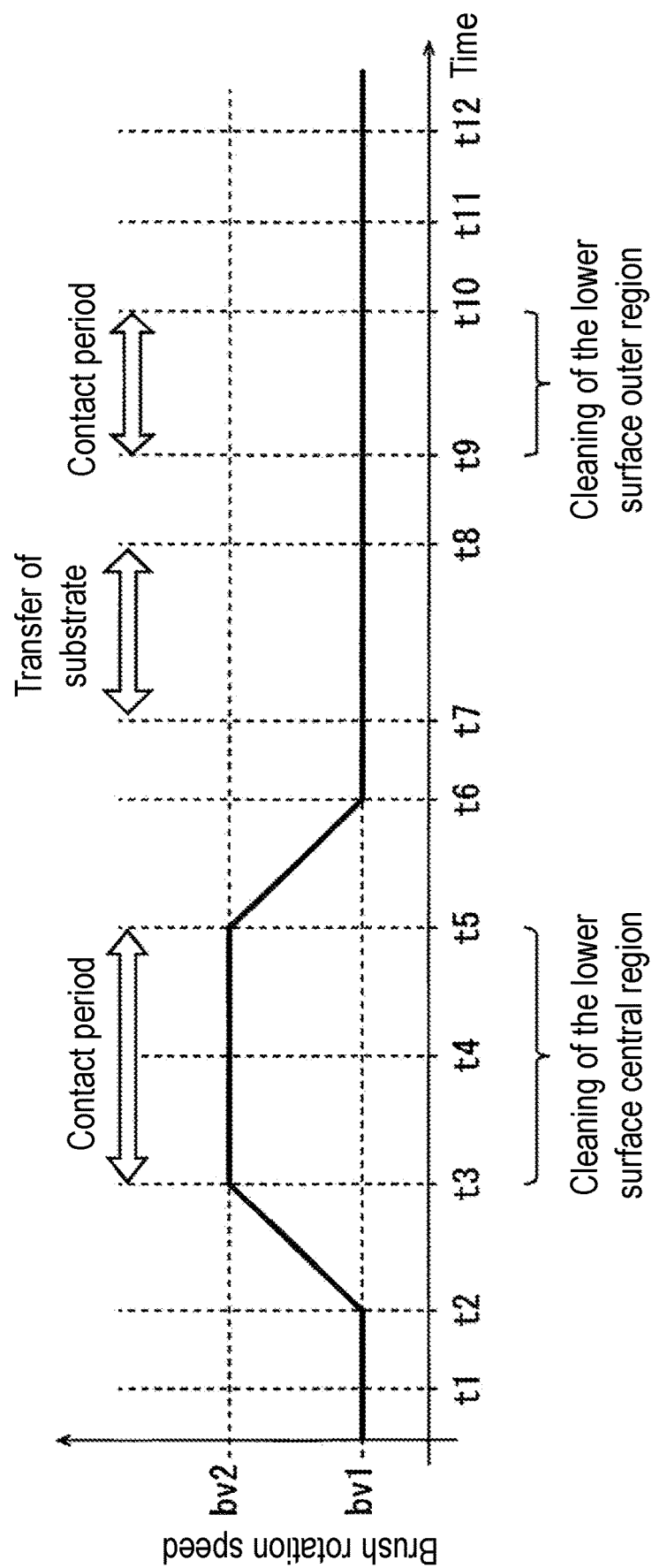
FIG. 11 is a time chart showing a change in rotation speed of the lower surface brush of FIG. 1 during cleaning of the lower surface of the substrate shown in FIG. 8 to FIG. 10.
Figure 12:
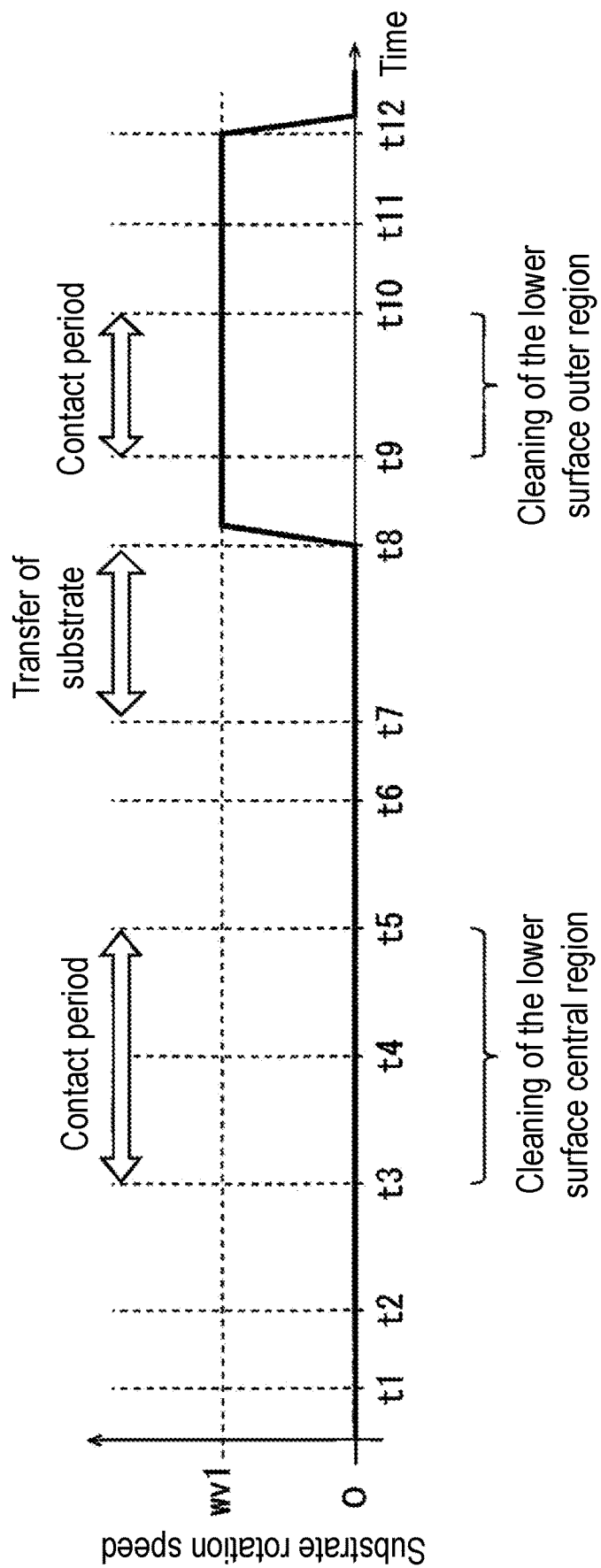
FIG. 12 is a time chart showing a change in rotation speed of the substrate during cleaning of the lower surface of the substrate shown in FIG. 8 to FIG. 10.

FIG. 11 is a time chart showing a change in rotation speed of the lower surface brush 51 of FIG. 1 during cleaning of the lower surface of the substrate W shown in FIG. 8 to FIG. 10. The time chart of FIG. 11 is shown graphically. In the graph of FIG. 11, the vertical axis represents the rotation speed of the lower surface brush 51 and the horizontal axis represents time. FIG. 12 is a time chart showing a change in rotation speed of the substrate W during cleaning of the lower surface of the substrate W shown in FIG. 8 to FIG. 10. The time chart of FIG. 12 is shown graphically. In the graph of FIG. 12, the vertical axis represents the rotation speed of the substrate W and the horizontal axis represents time.

Here, when cleaning the lower surface of the substrate W in the substrate cleaning apparatus 1, the movable pedestal 32 of the pedestal device 30 moves between predetermined first horizontal position P1, second horizontal position P2, and third horizontal position P3 on the linear guide 31 in the Y direction. The point labeled P1 in the schematic side views of FIG. 8 to FIG. 12 indicates the position of the central part of the movable pedestal 32 when the movable pedestal 32 is at the first horizontal position P1. The point labeled P2 indicates the position of the central part of the movable pedestal 32 when the movable pedestal 32 is at the second horizontal position P2. Furthermore, the point labeled P3 indicates the position of the central part of the movable pedestal 32 when the movable pedestal 32 is at the third horizontal position P3.

Further, when cleaning the lower surface of the substrate W in the substrate cleaning apparatus 1, the lower surface brush 51 moves between predetermined first height position, second height position, and third height position on the movable pedestal 32 in the Z direction (up-down direction). The first height position is a height position of the lower surface brush 51 when the lower surface brush 51 is at the lowest position within the range in which the elevation rotation support part 54 can raise and lower the lower surface brush 51. The second height position is higher than the first height position, and is a height position of the lower surface brush 51 when the cleaning surface of the lower surface brush 51 contacts the lower surface of the substrate W held by the upper holding devices 10A and 10B. The third height position is higher than the first height position and lower than the second height position, and is a height position of the lower surface brush 51 when the cleaning surface of the lower surface brush 51 contacts the lower surface of the substrate W sucked and held by the lower holding device 20.

Details of the operations of the pedestal device 30 and the lower surface cleaning device 50 during cleaning of the lower surface of the substrate W will be described below with reference to FIG. 8 to FIG. 12. As shown in the left part of FIG. 8, at time point t1 when cleaning of the lower surface of the substrate W is started, the substrate W is held in a horizontal posture by the upper holding devices 10A and 10B and fixed in the substrate cleaning apparatus 1. In this state, the movable pedestal 32 of the pedestal device 30 is at the first horizontal position P1. At this time, the rotation center (rotation axis) of the suction holding part 21 is positioned on a vertical axis passing through the center WC of the substrate W. Further, in the plan view, a large portion (a portion) of the cleaning surface of the lower surface brush 51 overlaps the substrate W, and a small portion (remaining other portion) of the cleaning surface of the lower surface brush 51 is positioned outside the outer peripheral end of the substrate W. The maximum value of the protrusion amount of the cleaning surface of the lower surface brush 51 from the lower surface of the substrate W in the radial direction of the substrate W is, for example, 7 mm (see symbol d1 in the upper left part of FIG. 8).

Further, the lower surface brush 51 is held at the first height position below the substrate W at time point t1. Thus, the lower surface brush 51 is separated from the substrate W by a predetermined distance. The lower surface brush 51 rotates at a predetermined first rotation speed bv1 (see FIG. 11), and the cleaning liquid is supplied to the lower surface brush 51 from the liquid nozzle 52. The first rotation speed bv1 is set to such an extent that the cleaning liquid supplied to the lower surface brush 51 does not scatter around the lower surface brush 51 (for example, 60 rpm or more and 130 rpm or less), and is 60 rpm in this embodiment. The rotation of the suction holding part 21 is stopped from time point t1 to time point t8, which will be described later (see FIG. 12).

When cleaning of the lower surface of the substrate W is started, in order to clean the lower surface central region of the substrate W, the movable pedestal 32 moves from the first horizontal position P1 toward the second horizontal position P2 from time point t1 to time point t2. As shown in the central part of FIG. 8, the rotation center (rotation axis) of the suction holding part 21 is shifted from the vertical axis passing through the center WC of the substrate W while the movable pedestal 32 is at the second horizontal position P2 at time point t2. Further, in the plan view, the entire cleaning surface of the lower surface brush 51 overlaps the substrate W. At this time, a gap is formed between the outer peripheral end of the lower surface brush 51 and the outer peripheral end of the substrate W in the radial direction of the substrate W. The minimum value of the size of the gap between the outer peripheral end of the lower surface brush 51 and the outer peripheral end of the substrate W is, for example, 3 mm (see symbol d2 in the upper central part of FIG. 8). While the movable pedestal 32 is at the second horizontal position P2, the region on the lower surface of the substrate W which faces the cleaning surface of the lower surface brush 51 in the up-down direction is the contact region R3 of FIG. 6.

Next, at time point t2, the supply of the cleaning liquid from the liquid nozzle 52 to the lower surface brush 51 is stopped. Besides, the lower surface brush 51 is raised toward the lower surface of the substrate W by the elevation rotation support part 54 from time point t2. Thus, as shown in the right part of FIG. 8, the lower surface brush 51 reaches the second height position at time point t3, which brings the lower surface brush 51 into contact with the contact region R3 of the lower surface of the substrate W. Here, as shown in FIG. 11, the rotation speed of the lower surface brush 51 increases from the first rotation speed bv1 to a predetermined second rotation speed bv2 as the lower surface brush 51 rises from time point t2 to time point t3. The second rotation speed bv2 is set within a predetermined speed range (for example, 100 rpm or more and 200 rpm or less) higher than the first rotation speed bv1, and is 150 rpm in this embodiment.

As described above, the lower surface brush 51 soaked with the cleaning liquid contacts the lower surface of the substrate W, and the lower surface brush 51 rotates, thereby cleaning the contact portion (contact region R3) between the lower surface brush 51 and the lower surface of the substrate W. In the lower surface view of the substrate W in the lower right part of FIG. 8, the portion cleaned by the lower surface brush 51 is indicated by hatching. At this time, the lower surface brush 51 does not contact the gap region R5 between the outer peripheral end of the substrate W and the contact region R3 in plan view. Thus, the contaminants removed by the lower surface brush 51 in the contact region R3 are prevented from going over the gap region R5 from the outer peripheral end of the substrate W to the upper surface side of the substrate W. Therefore, the cleanliness of the outer peripheral end of the substrate W and the upper surface of the substrate W is prevented from decreasing.

Next, while the lower surface brush 51 is in contact with the lower surface of the substrate W, the movable pedestal 32 moves in the Y direction from the second horizontal position P2 toward the third horizontal position P3 from time point t3 to time point t4. At this time, the rotation speed of the lower surface brush 51 is maintained at the second rotation speed bv2. Thus, a partial region of the lower surface of the substrate W including the lower surface central region R1 is cleaned by the lower surface brush 51, as indicated by hatching in the lower surface view of the substrate W in the lower left part of FIG. 9.

Thereafter, while the lower surface brush 51 is in contact with the lower surface of the substrate W, the movable pedestal 32 moves in the Y direction from the third horizontal position P3 toward the second horizontal position P2 from time point t4 to time point t5. Thus, the lower surface brush 51 reaches the separation region R4 on the lower surface of the substrate W, as shown in the central part of FIG. 9. Here, gas is ejected from the gas ejection part 53 toward the lower surface of the substrate W from time point t3 to time point t5 to form a gas curtain. As a result, even if the cleaning liquid contained in the lower surface brush 51 adheres to the lower surface of the substrate W, the cleaning liquid is prevented from remaining in the lower surface central region R1.

At time point t5, the lower surface brush 51 does not contact the gap region R5 between the outer peripheral end of the substrate W and the separation region R4 in plan view. Thus, the contaminants removed by the lower surface brush 51 in the gap region R5 are prevented from going over the gap region R5 from the outer peripheral end of the substrate W to the upper surface side of the substrate W. Therefore, the cleanliness of the outer peripheral end of the substrate W and the upper surface of the substrate W is prevented from decreasing.

Next, the lower surface brush 51 is lowered away from the substrate W from time point t5 to time point t6. Thus, the lower surface brush 51 is separated from the separation region R4 of the substrate W, and as shown in the right part of FIG. 9, the lower surface brush 51 reaches the first height position at time point t6. Here, as shown in FIG. 11, the rotation speed of the lower surface brush 51 decreases from the second rotation speed bv2 to the first rotation speed bv1 as the lower surface brush 51 lowers from time point t5 to time point t6. At time point t6, the supply of the cleaning liquid from the liquid nozzle 52 to the lower surface brush 51 is resumed. As a result, the contaminants adhering to the lower surface brush 51 are washed away by the supplied cleaning liquid.

Next, the movable pedestal 32 moves from the second horizontal position P2 toward the first horizontal position P1 from time point t6 to time point t7. Thus, as shown in the left part of FIG. 10, the lower surface brush 51 returns to the state at time point t1 when cleaning of the lower surface of the substrate W is started (see the left part of FIG. 8).

Subsequently, the substrate W is transferred from the upper holding devices 10A and 10B to the lower holding device 20 by the transfer device 40 of FIG. 1 from time point t6 to time point t7. Thus, as shown in the central part of FIG. 10, at time point t8, the lower surface central region R1 of the substrate W is sucked and held by the suction holding part 21 of the lower holding device 20 while the movable pedestal 32 of the pedestal device 30 is at the first horizontal position P1.

Thereafter, the supply of the cleaning liquid from the liquid nozzle 52 to the lower surface brush 51 is stopped, and the rotation of the substrate W performed by the lower holding device 20 is started as shown in FIG. 12. The rotation speed wv1 of the substrate W rotated by the lower holding device 20 is set to, for example, 200 rpm or more and 500 rpm or less, and is 500 rpm in this embodiment. Further, a cleaning liquid is supplied from a back rinse nozzle (not shown) toward the lower surface of the substrate W rotated by the lower holding device 20.

Next, the lower surface brush 51 rises toward the lower surface of the substrate W. As a result, as shown in the right part of FIG. 10, the lower surface brush 51 reaches the third height position at time point t9 and contacts the lower surface outer region R2 of the rotating substrate W.

From time point t9 to time point t10 after a certain period of time has passed, the lower surface brush 51 is kept in contact with the lower surface outer region R2 of the substrate W while the rotation of the substrate W is maintained. Thereby, the lower surface outer region R2 of the substrate W is cleaned. In the lower surface view of the substrate W in the lower right part of FIG. 10, the portion cleaned by the lower surface brush 51 is indicated by hatching.

The upper surface of the rotating substrate W is further cleaned by the upper surface cleaning device 70 of FIG. 1 during the period from time point t9 to time point t10. Besides, the outer peripheral end of the rotating substrate W is further cleaned by the end cleaning device 80 of FIG. 1. As a result, contaminants do not flow from the outer peripheral end of the substrate W to the upper surface of the substrate W during cleaning of the lower surface outer region R2 of the substrate W. A detailed description of the cleaning for the upper surface and the outer peripheral end of the substrate W will be omitted.

Thereafter, the lower surface brush 51 is lowered away from the substrate W by the elevation rotation support part 54 from time point t10 to time point t11. Further, the rotation speed wv1 of the substrate W is maintained for a predetermined period to spin-dry the substrate W. Finally, as shown in FIG. 12, the rotation of the substrate W is stopped at time point t12 and the cleaning of the lower surface of the substrate W is completed.

5. EFFECTS OF THE EMBODIMENT (a) When the lower surface brush 51 separated from the lower surface of the substrate W comes into contact with a partial region of the lower surface of the substrate W, contaminants resulting from the contact of the lower surface brush 51 tend to remain in the partial region of the lower surface of the substrate W. In this case, the degree of residual contaminants is reduced when the relative speed difference between the lower surface brush 51 and the substrate W at the time of contact of the lower surface brush 51 with a partial region of the lower surface of the substrate W is large.

Furthermore, when the lower surface brush 51 in contact with a partial region of the lower surface of the substrate W is separated from the lower surface of the substrate W, contaminants resulting from the separation of the lower surface brush 51 tend to remain in the partial region of the lower surface of the substrate W. In this case, the degree of residual contaminants is reduced when the relative speed difference between the lower surface brush 51 and the substrate W at the time of separation of the lower surface brush 51 from the partial region of the lower surface of the substrate W is large.

In the substrate cleaning apparatus 1 described above, the lower surface brush 51 is arranged at the second height position during cleaning of the lower surface central region R1 of the substrate W. The contaminants adhering to the substrate W are removed by rotating the lower surface brush 51 in contact with the lower surface of the substrate W. On the other hand, when the lower surface of the substrate W is not cleaned, the lower surface brush 51 is arranged at the first height position. At the first height position, the lower surface brush 51 rotates at the first rotation speed bv1. At this time, if the rotation speed of the lower surface brush 51 is excessively high, the contaminants or droplets adhering to the lower surface brush 51 may scatter around the lower surface brush 51 and reduce the cleanliness inside the substrate cleaning apparatus 1. Therefore, the first rotation speed bv1 is set lower than the second rotation speed bv2 at least during cleaning of the lower surface central region R1 of the substrate W.

According to the above configuration, the lower surface brush 51 rotates at the second rotation speed bv2 that is higher than the first rotation speed bv1 at the time point (time point t3 in FIG. 11) when the lower surface brush 51 comes into contact with the substrate W to clean the lower surface central region R1. In addition, the lower surface brush 51 rotates at the second rotation speed bv2 that is higher than the first rotation speed bv1 at the time point (time point t5 in FIG. 11) when the lower surface brush 51 is separated from the substrate W after cleaning the lower surface central region R1. Accordingly, the cleanliness of the lower surface of the substrate W after cleaning is improved, compared to a case where the lower surface brush 51 rotates at the first rotation speed bv1 or does not rotate, at the time point when the lower surface brush 51 comes into contact with the substrate W and at the time point when the lower surface brush 51 is separated from the substrate W.

During cleaning of the lower surface outer region R2 of the substrate W, the substrate W rotates at a relatively high rotation speed (for example, 500 rpm) while being sucked and held by the suction holding part 21. Therefore, a relatively large rotation speed difference is generated between the lower surface brush 51 and the substrate W even when the rotation speed of the lower surface brush 51 is maintained at the first rotation speed bv1. Accordingly, the residual contaminants resulting from contact with and separation from the lower surface of the substrate W are prevented when the lower surface brush 51 comes into contact with the substrate W and when the lower surface brush 51 is separated from the substrate W.

(b) The degree of residual contaminants resulting from the contact of the lower surface brush 51 is significantly reduced when the relative speed difference between the lower surface brush 51 and the substrate W at the time of contact of the lower surface brush 51 with the substrate W is greater than a specific relative speed difference. In addition, similar to the degree of residual contaminants resulting from the contact of the lower surface brush 51, the degree of residual contaminants resulting from the separation of the lower surface brush 51 is also significantly reduced when the relative speed difference between the lower surface brush 51 and the substrate W at the time of separation of the lower surface brush 51 from the substrate W is greater than a specific relative speed difference. Moreover, these specific relative speed differences are lower than the second rotation speed bv2 when the lower surface central region R1 of the substrate W is cleaned.

According to the substrate cleaning apparatus 1 described above, the lower surface brush 51 rotates at the second rotation speed bv2 at the time point when the lower surface brush 51 comes into contact with the substrate W and at the time point when the lower surface brush 51 is separated from the substrate W. Thus, the cleanliness of the lower surface of the substrate W after cleaning is further improved, compared to a case where the lower surface brush 51 rotates at the first rotation speed bv1 or does not rotate.

The specific relative speed difference described above may be determined through experiments or simulations according to the combination of the substrate W and the lower surface brush 51. In this case, the configuration is capable of improving the cleanliness of the lower surface of the substrate W after cleaning by setting the rotation speed of the lower surface brush 51 at the time point of contact of the lower surface brush 51 with the substrate W and at the time point of separation of the lower surface brush 51 from the substrate W greater than the determined specific relative speed difference.

(c) In the above embodiment, the lower surface brush 51 at the first height position rises to the second height position to clean the lower surface central region R1 of the substrate W. At this time, the rotation speed of the lower surface brush 51 increases from the first rotation speed bv1 to the second rotation speed bv2 as the lower surface brush 51 rises (time point t2 to time point t3 in FIG. 11).

In this case, since the lifting of the lower surface brush 51 and the adjustment of the rotation speed of the lower surface brush 51 are performed in parallel, the efficiency of cleaning the substrate W is prevented from dropping due to adjustment of the rotation speed of the lower surface brush 51.

The rotation speed of the lower surface brush 51 is set to the second rotation speed bv2 when the lower surface brush 51 reaches the second height position. Therefore, the rotation speed of the lower surface brush 51 is not limited to the example shown in FIG. 11, and may increase stepwise from time point t2 to time point t3 or may increase continuously while changing the acceleration.

(d) In the above embodiment, the lower surface brush 51 at the second height position is lowered to the first height position after cleaning the lower surface central region R1 of the substrate W. At this time, the rotation speed of the lower surface brush 51 decreases from the second rotation speed bv2 to the first rotation speed bv1 as the lower surface brush 51 is lowered (time point t5 to time point t6 in FIG. 11).

In this case, since the lowering of the lower surface brush 51 and the adjustment of the rotation speed of the lower surface brush 51 are performed in parallel, the efficiency of cleaning the substrate W is prevented from dropping due to adjustment of the rotation speed of the lower surface brush 51.

The rotation speed of the lower surface brush 51 is set to the second rotation speed bv2 when the lower surface brush 51 starts to lower from the second height position. Therefore, the rotation speed of the lower surface brush 51 is not limited to the example shown in FIG. 11, and may decrease stepwise from time point t5 to time point t6 or may decrease continuously while changing the acceleration.

(e) When the lower surface brush 51 separated from the lower surface of the substrate W comes into contact with a partial region of the lower surface of the substrate W, the contaminants resulting from the contact of the lower surface brush 51 tend to remain in the partial region. In addition, when the cleaning tool in contact with the substrate is separated from a partial region of the lower surface of the substrate, contaminants resulting from the separation of the lower surface brush 51 tend to remain in the partial region.

In the following description, as shown in FIG. 11 and FIG. 12, the period during which the lower surface brush 51 is in contact with the lower surface of the substrate W is called a contact period.

In the substrate cleaning apparatus 1 described above, the lower surface brush 51 is in contact with the lower surface central region R1 of the substrate W during at least a part of the contact period during which the lower surface brush 51 contacts the lower surface of the substrate W. Thereby, the lower surface central region R1 of the substrate W is cleaned. Further, the contact region R3 and the separation region R4 do not overlap the lower surface central region R1 of the substrate W. As a result, contaminants are less likely to remain in the lower surface central region R1 of the substrate W after cleaning, compared to a case where the contact region R3 and the separation region R4 overlap the lower surface central region R1. Therefore, the cleanliness of the lower surface central region R1 of the substrate W after cleaning is improved.

(f) In the substrate cleaning apparatus 1 described above, after the lower surface central region R1 of the substrate W is cleaned, the lower surface outer region R2 of the substrate W is cleaned while the lower surface central region R1 is sucked and held by the lower holding device 20. Here, the contact region R3 and the separation region R4 mostly overlap the lower surface outer region R2. Thus, even if there are contaminants remaining in the contact region R3 and the separation region R4 after cleaning of the lower surface central region R1 of the substrate W, the contaminants are removed during cleaning of the lower surface outer region R2 of the substrate W. Therefore, the cleanliness of the entire lower surface of the substrate W after cleaning the lower surface central region R1 and the lower surface outer region R2 of the substrate W is improved.

Further, according to the above configuration, the lower surface central region R1 has a high degree of cleanliness when the lower surface outer region R2 of the substrate W is cleaned. Therefore, when a plurality of substrates W are cleaned sequentially, the occurrence of cross contamination between the plurality of substrates W through the suction holding part 21 is prevented.

6. TEST FOR CONTAMINATION RESULTING FROM CONTACT AND SEPARATION OF THE LOWER SURFACE BRUSH 51

The inventors carried out the following test that set the contact region R3 and the separation region R4 not to overlap the lower surface central region R1 of the substrate W in the substrate cleaning apparatus 1 described above to confirm how much the cleanliness of the substrate W after cleaning was improved.

First, the inventors prepared a substrate W with the lower surface cleaned according to the above example of FIG. 8 to FIG. 12 as the cleaned substrate according to an example.

Then, the inventors prepared a cleaned substrate W with the lower surface cleaned by the same procedure as in the example of FIG. 8 to FIG. 12, except for the point that the contact region R3 and the gap region R5 were set to overlap the lower surface central region R1, as the cleaned substrate according to a comparative example.

Specifically, when cleaning the lower surface central region R1 of the substrate W according to the comparative example, while the movable pedestal 32 was held at the third horizontal position P3, the lower surface brush 51 was raised from the first height position to the second height position to bring the cleaning surface of the lower surface brush 51 into contact with the contact region R3 (lower surface central region R1) of the substrate W. Furthermore, while the movable pedestal 32 was held at the third horizontal position P3, the lower surface brush 51 was lowered from the second height position to the first height position to separate the cleaning surface of the lower surface brush 51 from the separation region R4 (lower surface central region R1) of the substrate W.

Figure 13:
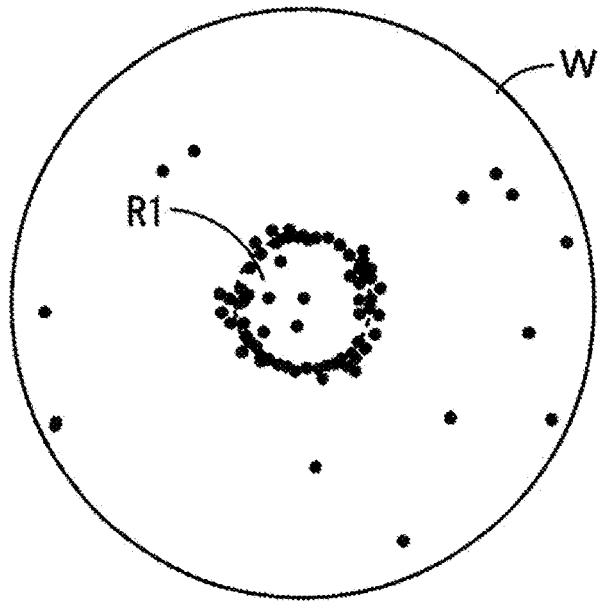
FIG. 13 is a diagram of contamination distribution on the lower surface of the substrate after cleaning according to an example.
Figure 14:
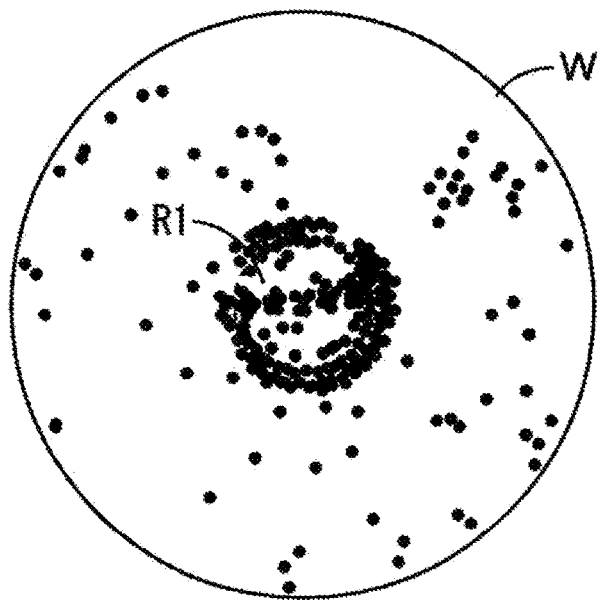
FIG. 14 is a diagram of contamination distribution on the lower surface of the substrate after cleaning according to a comparative example.

The inventors also confirmed the contamination state with a particle counter on the lower surface of each of the cleaned substrates according to the example and the comparative example prepared as described above. FIG. 13 is a diagram of contamination distribution on the lower surface of the substrate after cleaning according to the example, and FIG. 14 is a diagram of contamination distribution on the lower surface of the substrate after cleaning according to the comparative example. In FIG. 13 and FIG. 14, the distribution of contaminants adhering to the lower surface of each of the substrates after cleaning according to the example and the comparative example is indicated by a plurality of black dots.

As shown in FIG. 13 and FIG. 14, the number of contaminants adhering to the lower surface of the substrate after cleaning according to the example is smaller than the number of contaminants adhering to the lower surface of the substrate after cleaning according to the comparative example. Further, on the lower surface of the substrate after cleaning according to the example, chuck traces caused by the suction holding part 21 are found in the outer peripheral portion of the lower surface central region R1 and the vicinity thereof, but the number of contaminants adhering to other regions is relatively small.

In contrast, on the lower surface of the substrate after cleaning according to the comparative example, a large number of contaminants are adhered to the outer peripheral portion of the lower surface central region R1 and the vicinity thereof along with the chuck traces caused by the suction holding part 21, and the number of contaminants adhering to other regions is relatively large.

As a result, it was found that by setting the contact region R3 and the separation region R4 not to overlap the lower surface central region R1 of the substrate W, contaminants resulting from contact or separation of the lower surface brush 51 are less likely to remain in the lower surface central region R1.

7. OTHER EMBODIMENTS (a) In the substrate cleaning apparatus 1 according to the above embodiment, both the contact region R3 and the separation region R4 are defined not to overlap the lower surface central region R1, but the disclosure is not limited thereto. Either one of the contact region R3 and the separation region R4 may overlap the lower surface central region R1. Alternatively, both the contact region R3 and the separation region R4 may overlap the lower surface central region R1.

(b) In the substrate cleaning apparatus 1 according to the above embodiment, the lower surface brush 51 rotates at the second rotation speed bv2 at the time point (time point t3 in FIG. 11) when the lower surface brush 51 comes into contact with the substrate W to clean the lower surface central region R1. The second rotation speed bv2 according to the above embodiment is the rotation speed of the lower surface brush 51 when cleaning the lower surface central region R1 of the substrate W. However, the disclosure is not limited thereto.

The second rotation speed bv2, which corresponds to the time point (time point t3 in FIG. 11) when the lower surface brush 51 comes into contact with the substrate W to clean the lower surface central region R1, may be set higher than the rotation speed (hereinafter referred to as third rotation speed) when the lower surface brush 51 comes into contact with the lower surface central region R1 to clean the lower surface central region R1. Here, the third rotation speed is, for example, a speed for suitably cleaning the lower surface central region R1 while the lower surface brush 51 is in contact with the lower surface central region R1.

Further, in the substrate cleaning apparatus 1 according to the above embodiment, the lower surface brush 51 rotates at the second rotation speed bv2 at the time point (time point t5 in FIG. 11) when the lower surface brush 51 is separated from the substrate W after cleaning the lower surface central region R1. The second rotation speed bv2 according to the above embodiment is the rotation speed of the lower surface brush 51 when cleaning the lower surface central region R1 of the substrate W. However, the disclosure is not limited thereto.

The second rotation speed bv2, which corresponds to the time point (time point t5 in FIG. 11) when the lower surface brush 51 is separated from the substrate W after cleaning the lower surface central region R1, may be set higher than the rotation speed (referred to as third rotation speed) when the lower surface brush 51 comes into contact with the lower surface central region R1 to clean the lower surface central region R1.

Furthermore, the rotation speed at the time point (time point t5 in FIG. 11) when the lower surface brush 51 is separated from the substrate W after cleaning the lower surface central region R1 may be different from the rotation speed at the time point (time point t3 in FIG. 11) when the lower surface brush 51 comes into contact with the substrate W to clean the lower surface central region R1.

Figure 15:
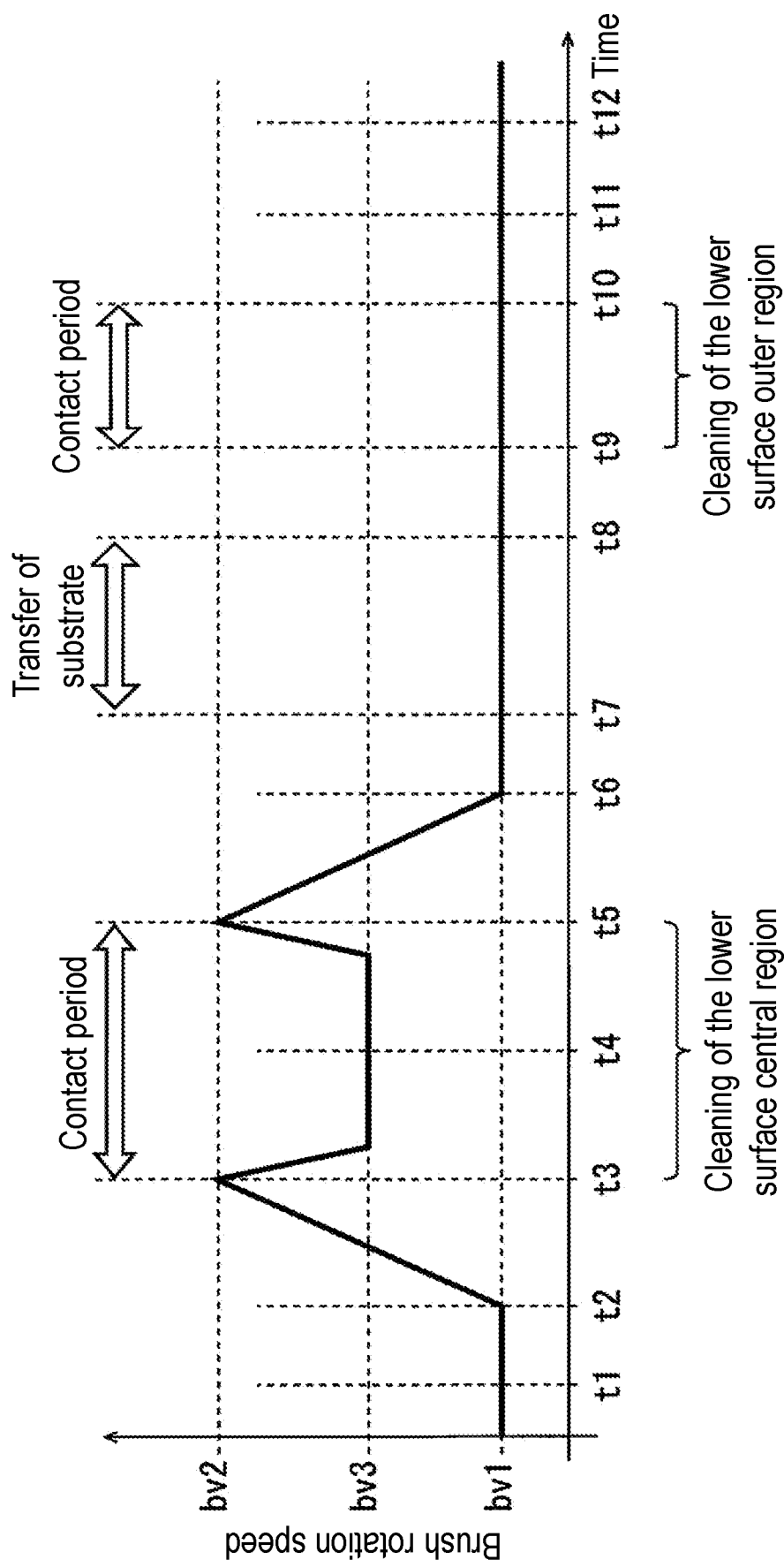
FIG. 15 is a time chart for illustrating rotation control of the lower surface brush according to another embodiment.

As described above, an example of setting the second rotation speed bv2 of the lower surface brush 51, which corresponds to the time point of contact of the lower surface brush 51 with the substrate W and the time point of separation of the lower surface brush 51 from the substrate W, higher than the third rotation speed will be described. FIG. 15 is a time chart for illustrating rotation control of the lower surface brush 51 according to another embodiment. The time chart of FIG. 15 corresponds to the time chart of FIG. 11, and shows a change in rotation speed of the lower surface brush 51 of FIG. 1 when cleaning the lower surface of the substrate W. The differences between the time chart of FIG. 15 and the time chart of FIG. 11 will be described.

As shown in FIG. 15, in this example, the second rotation speed bv2 of the lower surface brush 51, at the time point (time point t3 in FIG. 11) when the lower surface brush 51 comes into contact with the substrate W to clean the lower surface central region R1 and the time point (time point t5 in FIG. 11) when the lower surface brush 51 is separated from the substrate W after cleaning the lower surface central region R1, is set higher than the first rotation speed bv1 and the third rotation speed bv3. For example, when the third rotation speed bv3 is 150 rpm, the second rotation speed bv2 is set to, for example, 200 rpm or more and 250 rpm or less.

As described above, the degree of residual contaminants resulting from contact and separation of the lower surface brush 51 is reduced when the relative speed difference between the lower surface brush 51 and the substrate W is large. Therefore, according to the example of FIG. 15, the degree of residual contaminants resulting from contact and separation of the lower surface brush 51 is further reduced.

(c) In the substrate cleaning apparatus 1 according to the above embodiment, the lower surface brush 51 rotates at the second rotation speed bv2 at both the time point (time point t3 in FIG. 11) when the lower surface brush 51 comes into contact with the substrate W to clean the lower surface central region R1 and the time point (time point t5 in FIG. 11) when the lower surface brush 51 is separated from the substrate W after cleaning the lower surface central region R1. However, the disclosure is not limited thereto. The lower surface brush 51 may rotate at a rotation speed lower than the second rotation speed bv2 at one of the time point (time point t3 in FIG. 11) when the lower surface brush 51 comes into contact with the substrate W and the time point (time point t5 in FIG. 11) when the lower surface brush 51 is separated from the substrate W.

(d) In the substrate cleaning apparatus 1 according to the above embodiment, the gap region R5 is defined in the substrate W. Thus, the lower surface brush 51 does not contact the outer peripheral end of the substrate W when cleaning the lower surface central region R1 of the substrate W held by the upper holding devices 10A and 10B. However, the disclosure is not limited thereto. The gap region R5 may not be set in the substrate W.

(e) In the substrate cleaning apparatus 1 according to the above embodiment, both the lower surface central region R1 and the lower surface outer region R2 of the substrate W are cleaned by the lower surface cleaning device 50, but the disclosure is not limited thereto. A configuration for cleaning the lower surface central region R1 of the substrate W and a configuration for cleaning the lower surface outer region R2 of the substrate W may be provided separately.

8. CORRESPONDENCE RELATIONSHIP BETWEEN EACH COMPONENT OF THE CLAIMS AND EACH PART OF THE EMBODIMENT

An example of the correspondence between each component of the claims and each element of the embodiment will be described below, but the disclosure is not limited to the following example. Various other elements having the configurations or functions described in the claims can be used as the components of the claims.

In the above embodiment, the upper holding devices 10A and 10B are examples of the first substrate holding part, the lower surface brush 51 is an example of the cleaning tool, the elevation rotation support part 54 is an example of the cleaning tool rotation driving part, the second height position is an example of the contact position, the first height position is an example of the separation position, the pedestal device 30 and the elevation rotation support part 54 are examples of the cleaning tool moving part, the first rotation speed bv1 is an example of the first rotation speed, the second rotation speed bv2 is an example of the second rotation speed, and the third rotation speed bv3 is an example of the third rotation speed.

Further, time point t3 at which the lower surface of the substrate W is cleaned as shown in FIG. 8 to FIG. 12 is an example of the first time point, time point t5 at which the lower surface of the substrate W is cleaned as shown in FIG. 8 to FIG. 12 is an example of the second time point, the substrate cleaning apparatus 1 is an example of the substrate cleaning apparatus, the lower surface central region R1 is an example of the lower surface central region, the lower holding device 20 is an example of the second substrate holding part, and the lower surface outer region R2 is an example of the lower surface outer region.

9. SUMMARY OF THE EMBODIMENT (Configuration 1) A substrate cleaning apparatus according to configuration 1 includes:
  a first substrate holding part holding an outer peripheral end of a substrate;
  a cleaning tool coming into contact with a lower surface of the substrate and cleaning the lower surface of the substrate;
  a cleaning tool rotation driving part rotating the cleaning tool around an axis in an up-down direction; and
  a cleaning tool moving part moving the cleaning tool rotated by the cleaning tool rotation driving part between a contact position where the cleaning tool comes into contact with the lower surface of the substrate held by the first substrate holding part and a separation position where the cleaning tool is separated from the lower surface of the substrate held by the first substrate holding part by a predetermined distance,
  wherein the cleaning tool rotation driving part
  rotates the cleaning tool at a first rotation speed in response to the cleaning tool being at the separation position, and
  rotates the cleaning tool at a second rotation speed that is higher than the first rotation speed at at least one of a first time point and a second time point in a case where the first time point is a time point at which the cleaning tool in a state of being separated from the lower surface of the substrate comes into contact with the lower surface of the substrate in response to the cleaning tool moving from the separation position to the contact position, and the second time point is a time point at which the cleaning tool in a state of contacting the lower surface of the substrate is separated from the lower surface of the substrate in response to the cleaning tool moving from the contact position to the separation position.

When the cleaning tool separated from the lower surface of the substrate comes into contact with a partial region of the lower surface of the substrate, contaminants resulting from the contact of the cleaning tool tend to remain in the partial region of the lower surface of the substrate. In this case, the degree of residual contaminants is reduced when the relative speed difference between the cleaning tool and the substrate at the time of contact of the cleaning tool with a partial region of the lower surface of the substrate is large.

Furthermore, when the cleaning tool in contact with a partial region of the lower surface of the substrate is separated from the lower surface of the substrate, contaminants resulting from the separation of the cleaning tool tend to remain in the partial region of the lower surface of the substrate. In this case, the degree of residual contaminants is reduced when the relative speed difference between the cleaning tool and the substrate at the time of separation of the cleaning tool from the partial region of the lower surface of the substrate is large.

In the substrate cleaning apparatus, the cleaning tool is arranged at the contact position during cleaning of the lower surface of the substrate. The contaminants adhering to the substrate are removed by rotating the cleaning tool in contact with the lower surface of the substrate. On the other hand, when the lower surface of the substrate is not cleaned, the cleaning tool is arranged at the separation position. At the separation position, the cleaning tool rotates at the first rotation speed. At this time, if the rotation speed of the cleaning tool is excessively high, the contaminants or droplets adhering to the cleaning tool may scatter around the cleaning tool and reduce the cleanliness inside the substrate cleaning apparatus. Therefore, the first rotation speed is set at least lower than the rotation speed during cleaning of the substrate.

According to the above configuration, the cleaning tool rotates at a rotation speed that is higher than the first rotation speed at at least one of the first time point and the second time point. Thus, the cleanliness of the lower surface of the substrate after cleaning is improved, compared to a case where the cleaning tool rotates at the first rotation speed or does not rotate, at both the first time point and the second time point.

(Configuration 2) In the substrate cleaning apparatus according to configuration 1, a cleaning liquid may be supplied to the cleaning tool in response to the cleaning tool being at the separation position, and the first rotation speed may be a rotation speed at which the cleaning liquid supplied to the cleaning tool does not scatter.

In this case, the cleaning liquid supplied to the cleaning tool at the separation position flows smoothly on the surface of the cleaning tool or inside the cleaning tool due to the centrifugal force generated by the rotation of the cleaning tool at the first rotation speed. Thus, contaminants adhering to the cleaning tool at the separation position are smoothly washed away by the cleaning liquid. Besides, since the first rotation speed is set to such an extent that the cleaning liquid supplied to the cleaning tool does not scatter, the cleanliness inside the substrate cleaning apparatus is prevented from decreasing due to the rotation of the cleaning tool at the separation position.

(Configuration 3) In the substrate cleaning apparatus according to configuration 1 or 2, the cleaning tool rotation driving part may rotate the cleaning tool at a third rotation speed that is higher than the first rotation speed in a state where the cleaning tool is at the contact position and the cleaning tool is in contact with the lower surface of the substrate, and the second rotation speed may be a rotation speed equal to or higher than the third rotation speed.

The degree of residual contaminants resulting from the contact of the cleaning tool is significantly reduced when the relative speed difference between the cleaning tool and the substrate at the time of contact of the cleaning tool with the substrate is greater than a specific relative speed difference. In addition, similar to the degree of residual contaminants resulting from the contact of the cleaning tool, the degree of residual contaminants resulting from the separation of the cleaning tool is also significantly reduced when the relative speed difference between the cleaning tool and the substrate at the time of separation of the cleaning tool from the substrate is greater than a specific relative speed difference. Moreover, these specific relative speed differences are lower than the third rotation speed when the lower surface of the substrate is cleaned.

According to the substrate cleaning apparatus described above, the cleaning tool rotates at a rotation speed equal to or higher than the third rotation speed at at least one of the first time point and the second time point. Thus, the cleanliness of the lower surface of the substrate after cleaning is further improved, compared to a case where the cleaning tool rotates at the first rotation speed or does not rotate, at both the first time point and the second time point.

(Configuration 4) In the substrate cleaning apparatus according to any one of configurations 1 to 3, the cleaning tool rotation driving part may increase a rotation speed of the cleaning tool from the first rotation speed to the second rotation speed before the first time point and until the cleaning tool moves from the separation position and reaches the contact position.

In this case, the rotation speed of the cleaning tool can be set to the second rotation speed at the first time point. In addition, since the movement of the cleaning tool and the adjustment of the rotation speed of the cleaning tool are performed in parallel, the efficiency of cleaning the substrate is prevented from dropping due to adjustment of the rotation speed of the cleaning tool.

(Configuration 5) In the substrate cleaning apparatus according to any one of configurations 1 to 4, the cleaning tool rotation driving part may decrease a rotation speed of the cleaning tool from the second rotation speed to the first rotation speed after the second time point and until the cleaning tool moves from the contact position and reaches the separation position.

In this case, the rotation speed of the cleaning tool can be set to the second rotation speed at the second time point. In addition, since the movement of the cleaning tool and the adjustment of the rotation speed of the cleaning tool are performed in parallel, the efficiency of cleaning the substrate is prevented from dropping due to adjustment of the rotation speed of the cleaning tool.

(Configuration 6) In the substrate cleaning apparatus according to any one of configurations 1 to 5, the cleaning tool moving part may clean a lower surface central region of the substrate by moving the cleaning tool into contact with the lower surface central region of the substrate in a state where the substrate is held by the first substrate holding part. The substrate cleaning apparatus may further include a second substrate holding part rotating the substrate around an axis in the up-down direction while sucking and holding the lower surface central region after cleaning the lower surface central region of the substrate, and the cleaning tool moving part may move the cleaning tool relative to the rotating substrate held by the second substrate holding part so that the cleaning tool comes into contact with a lower surface outer region that surrounds the lower surface central region of the substrate.

In this case, after the lower surface central region of the substrate is cleaned, the lower surface outer region of the substrate is cleaned while the lower surface central region is sucked and held by the second substrate holding part. Therefore, the cleanliness of the entire lower surface of the substrate is improved after cleaning the lower surface central region and the lower surface outer region of the substrate.

Further, according to the above configuration, the lower surface central region of the substrate has a high degree of cleanliness when the lower surface outer region of the substrate is cleaned. Therefore, when a plurality of substrates are cleaned sequentially, the occurrence of cross contamination between the plurality of substrates through the second substrate holding part is prevented.

(Configuration 7) In the substrate cleaning apparatus according to any one of configurations 1 to 6, the first substrate holding part may be configured to hold the outer peripheral end of the substrate without rotating the substrate.

In this case, the lower surface of the substrate fixed in a fixed posture can be cleaned efficiently.

(Configuration 8) A substrate cleaning method according to configuration 8 includes:

holding an outer peripheral end of a substrate with a first substrate holding part;

bringing a cleaning tool into contact with a lower surface of the substrate and cleaning the lower surface of the substrate;

rotating the cleaning tool around an axis in an up-down direction; and moving the cleaning tool rotated around the axis in the up-down direction between a contact position where the cleaning tool comes into contact with the lower surface of the substrate held by the first substrate holding part and a separation position where the cleaning tool is separated from the lower surface of the substrate held by the first substrate holding part by a predetermined distance, wherein rotating the cleaning tool around the axis in the up-down direction includes rotating the cleaning tool at a first rotation speed in response to the cleaning tool being at the separation position, and rotating the cleaning tool at a second rotation speed that is higher than the first rotation speed at at least one of a first time point and a second time point in a case where the first time point is a time point at which the cleaning tool in a state of being separated from the lower surface of the substrate comes into contact with the lower surface of the substrate in response to the cleaning tool moving from the separation position to the contact position, and the second time point is a time point at which the cleaning tool in a state of contacting the lower surface of the substrate is separated from the lower surface of the substrate in response to the cleaning tool moving from the contact position to the separation position.

In the substrate cleaning method, the cleaning tool is arranged at the contact position during cleaning of the lower surface of the substrate. The contaminants adhering to the substrate are removed by rotating the cleaning tool in contact with the lower surface of the substrate. On the other hand, when the lower surface of the substrate is not cleaned, the cleaning tool is arranged at the separation position. At the separation position, the cleaning tool rotates at the first rotation speed at least lower than the rotation speed during cleaning of the substrate.

According to the substrate cleaning method described above, the cleaning tool rotates at a rotation speed that is higher than the first rotation speed at at least one of the first time point and the second time point. Thus, the cleanliness of the lower surface of the substrate after cleaning is improved, compared to a case where the cleaning tool rotates at the first rotation speed or does not rotate, at both the first time point and the second time point.

(Configuration 9) In the substrate cleaning method according to configuration 8, a cleaning liquid may be supplied to the cleaning tool in response to the cleaning tool being at the separation position, and the first rotation speed may be a rotation speed at which the cleaning liquid supplied to the cleaning tool does not scatter.

In this case, the cleaning liquid supplied to the cleaning tool at the separation position flows smoothly on the surface of the cleaning tool or inside the cleaning tool due to the centrifugal force generated by the rotation of the cleaning tool at the first rotation speed. Thus, contaminants adhering to the cleaning tool at the separation position are smoothly washed away by the cleaning liquid. Besides, since the first rotation speed is set to such an extent that the cleaning liquid supplied to the cleaning tool does not scatter, the cleanliness of the cleaning environment including the separation position is prevented from decreasing due to the rotation of the cleaning tool at the separation position.

(Configuration 10) In the substrate cleaning method according to configuration 8 or 9, rotating the cleaning tool around the axis in the up-down direction may include rotating the cleaning tool at a third rotation speed that is higher than the first rotation speed in a state where the cleaning tool is at the contact position and the cleaning tool is in contact with the lower surface of the substrate, and the second rotation speed may be a rotation speed equal to or higher than the third rotation speed.

In this case, the cleaning tool rotates at a rotation speed that is equal to or higher than the third rotation speed at at least one of the first time point and the second time point. Thus, the cleanliness of the lower surface of the substrate after cleaning is further improved, compared to a case where the cleaning tool rotates at the first rotation speed or does not rotate, at both the first time point and the second time point.

(Configuration 11) In the substrate cleaning method according to any one of configurations 8 to 10, rotating the cleaning tool around the axis in the up-down direction may include increasing a rotation speed of the cleaning tool from the first rotation speed to the second rotation speed before the first time point and until the cleaning tool moves from the separation position and reaches the contact position.

In this case, the rotation speed of the cleaning tool can be set to the second rotation speed at the first time point. In addition, since the movement of the cleaning tool and the adjustment of the rotation speed of the cleaning tool are performed in parallel, the efficiency of cleaning the substrate is prevented from dropping due to adjustment of the rotation speed of the cleaning tool.

(Configuration 12) In the substrate cleaning method according to any one of configurations 8 to 11, rotating the cleaning tool around the axis in the up-down direction may include decreasing a rotation speed of the cleaning tool from the second rotation speed to the first rotation speed after the second time point and until the cleaning tool moves from the contact position and reaches the separation position.

In this case, the rotation speed of the cleaning tool can be set to the second rotation speed at the second time point. In addition, since the movement of the cleaning tool and the adjustment of the rotation speed of the cleaning tool are performed in parallel, the efficiency of cleaning the substrate is prevented from dropping due to adjustment of the rotation speed of the cleaning tool.

(Configuration 13) In the substrate cleaning method according to any one of configurations 8 to 12, moving the cleaning tool may include cleaning a lower surface central region of the substrate by moving the cleaning tool into contact with the lower surface central region of the substrate in a state where the substrate is held by the first substrate holding part. The substrate cleaning method may further include rotating the substrate around an axis in the up-down direction while sucking and holding the lower surface central region with a second substrate holding part after cleaning the lower surface central region of the substrate, and moving the cleaning tool may further include moving the cleaning tool relative to the rotating substrate held by the second substrate holding part so that the cleaning tool comes into contact with a lower surface outer region that surrounds the lower surface central region of the substrate.

In this case, after the lower surface central region of the substrate is cleaned, the lower surface outer region of the substrate is cleaned while the lower surface central region is sucked and held by the second substrate holding part. Therefore, the cleanliness of the entire lower surface of the substrate is improved after cleaning the lower surface central region and the lower surface outer region of the substrate.

Further, according to the above configuration, the lower surface central region of the substrate has a high degree of cleanliness when the lower surface outer region of the substrate is cleaned. Therefore, when a plurality of substrates are cleaned sequentially, the occurrence of cross contamination between the plurality of substrates through the second substrate holding part is prevented.

(Configuration 14) In the substrate cleaning method according to any one of configurations 8 to 13, the first substrate holding part may be configured to hold the outer peripheral end of the substrate without rotating the substrate.

In this case, the lower surface of the substrate fixed in a fixed posture can be cleaned efficiently.

With the substrate cleaning apparatus according to the above embodiment, the cleanliness of the lower surface central region of the substrate after cleaning is improved, which improves the yield of products obtained by substrate processing. Thereby, ineffective substrate processing is reduced to achieve energy saving in the substrate processing. Besides, there is no need to set a long cleaning period for the lower surface of the substrate to improve the cleanliness of the lower surface of the substrate. Thus, the disclosure is capable of reducing a waste of chemicals or the like, thereby contributing to the reduction of contamination in the earth environment.

While preferred embodiments of the present disclosure have been described above, it is to be understood that variations and modifications will be apparent to those skilled in the art without departing the scope and spirit of the present disclosure. The scope of the present disclosure, therefore, is to be determined solely by the following claims.

What is claimed is:

1. A substrate cleaning method, comprising:
holding an outer peripheral end of a substrate with a first substrate holding part;
bringing a cleaning tool into contact with a lower surface of the substrate and cleaning the lower surface of the substrate;
rotating the cleaning tool around an axis in an up-down direction; and
moving the cleaning tool rotated around the axis in the up-down direction between a contact position where the cleaning tool comes into contact with the lower surface of the substrate held by the first substrate holding part and a separation position where the cleaning tool is separated from the lower surface of the substrate held by the first substrate holding part by a predetermined distance,
wherein rotating the cleaning tool around the axis in the up-down direction comprises
rotating the cleaning tool at a first rotation speed in response to the cleaning tool being at the separation position, and
rotating the cleaning tool at a second rotation speed that is higher than the first rotation speed at least one of a first time point and a second time point in a case where the first time point is a time point at which the cleaning tool in a state of being separated from the lower surface of the substrate comes into contact with the lower surface of the substrate in response to the cleaning tool moving from the separation position to the contact position, and the second time point is a time point at which the cleaning tool in a state of contacting the lower surface of the substrate is separated from the lower surface of the substrate in response to the cleaning tool moving from the contact position to the separation position.

2. The substrate cleaning method according to claim 1, wherein a cleaning liquid is supplied to the cleaning tool in response to the cleaning tool being at the separation position, and the first rotation speed is a rotation speed at which the cleaning liquid supplied to the cleaning tool does not scatter.

3. The substrate cleaning method according to claim 1, wherein rotating the cleaning tool around the axis in the up-down direction comprises rotating the cleaning tool at a third rotation speed that is higher than the first rotation speed in a state where the cleaning tool is at the contact position and the cleaning tool is in contact with the lower surface of the substrate, and the second rotation speed is a rotation speed equal to or higher than the third rotation speed.

4. The substrate cleaning method according to claim 1, wherein rotating the cleaning tool around the axis in the up-down direction comprises increasing a rotation speed of the cleaning tool from the first rotation speed to the second rotation speed before the first time point and until the cleaning tool moves from the separation position and reaches the contact position.

5. The substrate cleaning method according to claim 1, wherein rotating the cleaning tool around the axis in the up-down direction comprises decreasing a rotation speed of the cleaning tool from the second rotation speed to the first rotation speed after the second time point and until the cleaning tool moves from the contact position and reaches the separation position.

6. The substrate cleaning method according to claim 1, wherein moving the cleaning tool comprises cleaning a lower surface central region of the substrate by moving the cleaning tool into contact with the lower surface central region of the substrate in a state where the substrate is held by the first substrate holding part, the substrate cleaning method further comprises rotating the substrate around an axis in the up-down direction while sucking and holding the lower surface central region with a second substrate holding part after cleaning the lower surface central region of the substrate, and moving the cleaning tool further comprises moving the cleaning tool relative to the rotating substrate held by the second substrate holding part so that the cleaning tool comes into contact with a lower surface outer region that surrounds the lower surface central region of the substrate.

7. The substrate cleaning method according to claim 1, wherein the first substrate holding part is configured to hold the outer peripheral end of the substrate without rotating the substrate.

* * * * *